US010032649B2

(12) United States Patent
Williams et al.

(10) Patent No.: US 10,032,649 B2
(45) Date of Patent: Jul. 24, 2018

(54) METHOD OF FABRICATING LOW-PROFILE FOOTED POWER PACKAGE

(71) Applicant: Adventive Technology Ltd., Hong Kong (CN)

(72) Inventors: Richard K. Williams, Cupertino, CA (US); Keng Hung Lin, Chupei (TW)

(73) Assignee: Adventive IPBank, Luxembourg (LU)

( * ) Notice: Subject to any disclaimer, the term of this patent is extended or adjusted under 35 U.S.C. 154(b) by 0 days.

(21) Appl. No.: 15/453,136

(22) Filed: Mar. 8, 2017

(65) Prior Publication Data
US 2017/0178928 A1 Jun. 22, 2017

Related U.S. Application Data

(60) Division of application No. 14/703,359, filed on May 4, 2015, now Pat. No. 9,620,439, which is a
(Continued)

(51) Int. Cl.
*H01L 21/44* (2006.01)
*H01L 21/48* (2006.01)
(Continued)

(52) U.S. Cl.
CPC ...... *H01L 21/4882* (2013.01); *H01L 21/4828* (2013.01); *H01L 21/565* (2013.01); *H01L 23/29* (2013.01); *H01L 23/3121* (2013.01); *H01L 23/367* (2013.01); *H01L 23/4952* (2013.01); *H01L 23/49503* (2013.01); *H01L 23/49513* (2013.01); *H01L 23/49551* (2013.01); *H01L 23/49555* (2013.01); *H01L 23/49562* (2013.01);
(Continued)

(58) Field of Classification Search
CPC ............ H01L 21/4882; H01L 21/4828; H01L 21/565; H01L 23/367
USPC ........................................................ 438/123
See application file for complete search history.

(56) References Cited

U.S. PATENT DOCUMENTS 4,935,803 A 6/1990 Kalfus et al.
6,307,755 B1 10/2001 Williams et al.
(Continued)

Primary Examiner — David S Blum
(74) Attorney, Agent, or Firm — Patentability Associates; David E. Steuber

(57) ABSTRACT

A method is disclosed of fabricating a power package which includes a heat tab extending from a die pad exposed on the underside of the package, which facilitates the removal of heat from the die to the PCB or other surface on which the package is mounted. The heat tab has a bottom surface coplanar with the flat bottom surface of the die pad and bottom surface of a lead. The lead includes a horizontal foot segment, a vertical columnar segment, and a horizontal cantilever segment facing the die pad. The heat tab may also have a foot. A die containing a power device is mounted on a top surface of the die pad and may be electrically connected to the lead using a bonding wire or clip. The die may be mounted on the die pad with as electrically conductive material, and the package may also include a lead that extends from the die pad and is thus electrically tied to the bottom of the die. The result is a package with a minimal footprint that is suitable for the technique known as "wave soldering" that is used in relatively low-cost printed circuit board assembly factories.

14 Claims, 43 Drawing Sheets

Related U.S. Application Data continuation-in-part of application No. 14/056,287, filed on Oct. 17, 2013, now Pat. No. 9,576,884.

(60) Provisional application No. 61/775,540, filed on Mar. 9, 2013, provisional application No. 61/775,544, filed on Mar. 9, 2013.

(51) Int. Cl.
| | |
|---|---|
| *H01L 21/50* | (2006.01) |
| *H01L 23/495* | (2006.01) |
| *H01L 21/56* | (2006.01) |
| *H01L 23/00* | (2006.01) |
| *H01L 23/29* | (2006.01) |
| *H01L 23/367* | (2006.01) |
| *H01L 23/31* | (2006.01) |

(52) U.S. Cl.
CPC ........ *H01L 23/49568* (2013.01); *H01L 24/40* (2013.01); *H01L 24/97* (2013.01); *H01L 23/3107* (2013.01); *H01L 24/29* (2013.01); *H01L 24/32* (2013.01); *H01L 24/37* (2013.01); *H01L 24/45* (2013.01); *H01L 2224/0603* (2013.01); *H01L 2224/16245* (2013.01); *H01L 2224/2929* (2013.01); *H01L 2224/29101* (2013.01); *H01L 2224/32245* (2013.01); *H01L 2224/37147* (2013.01); *H01L 2224/40095* (2013.01); *H01L 2224/40245* (2013.01); *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2224/48464* (2013.01); *H01L 2224/4903* (2013.01); *H01L 2224/49171* (2013.01); *H01L 2224/73257* (2013.01); *H01L 2224/73265* (2013.01); *H01L 2224/8385* (2013.01); *H01L 2224/83801* (2013.01); *H01L 2224/8485* (2013.01); *H01L 2224/84801* (2013.01); *H01L 2224/92247* (2013.01); *H01L 2224/97* (2013.01); *H01L 2924/00014* (2013.01); *H01L 2924/0781* (2013.01); *H01L 2924/1305* (2013.01); *H01L 2924/13055* (2013.01); *H01L 2924/13091* (2013.01); *H01L 2924/181* (2013.01)

(56) References Cited

U.S. PATENT DOCUMENTS

| | | |
|---|---|---|
| 6,891,256 B2 | 5/2005 | Joshi et al. |
| 8,513,787 B2 | 8/2013 | Williams et al. |
| 8,575,006 B2 | 11/2013 | Xue et al. |
| 2007/0284720 A1 | 12/2007 | Otremba et al. |
| 2008/0017907 A1 | 1/2008 | Otremba |
| 2011/0115069 A1 | 5/2011 | Teh et al. |
| 2012/0025227 A1 | 2/2012 | Chan et al. |
| 2013/0043572 A1* | 2/2013 | Williams ............ H01L 23/3677 257/675 |

\* cited by examiner

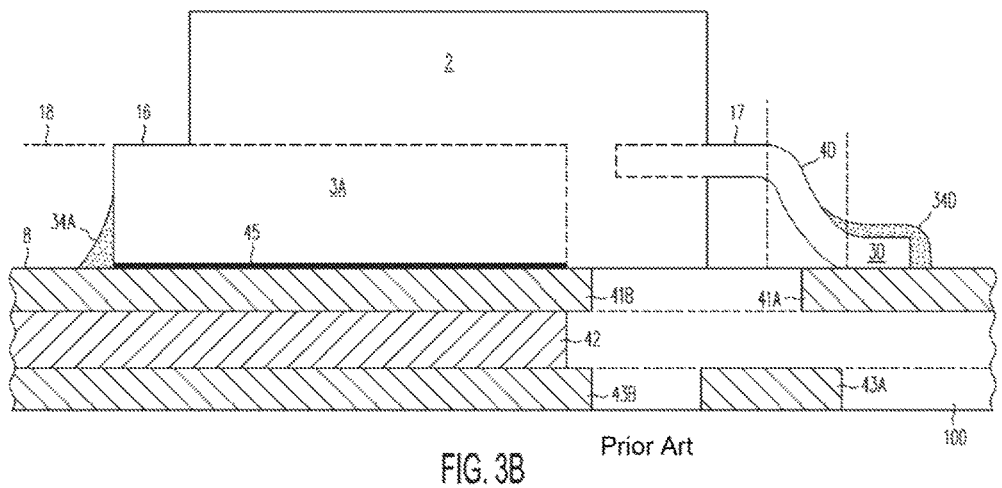

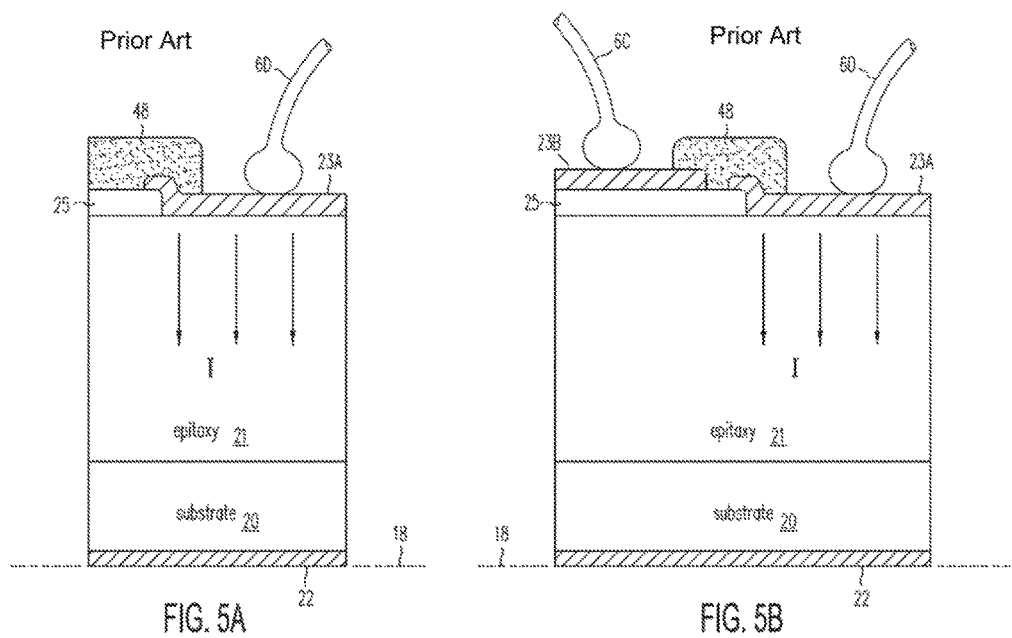

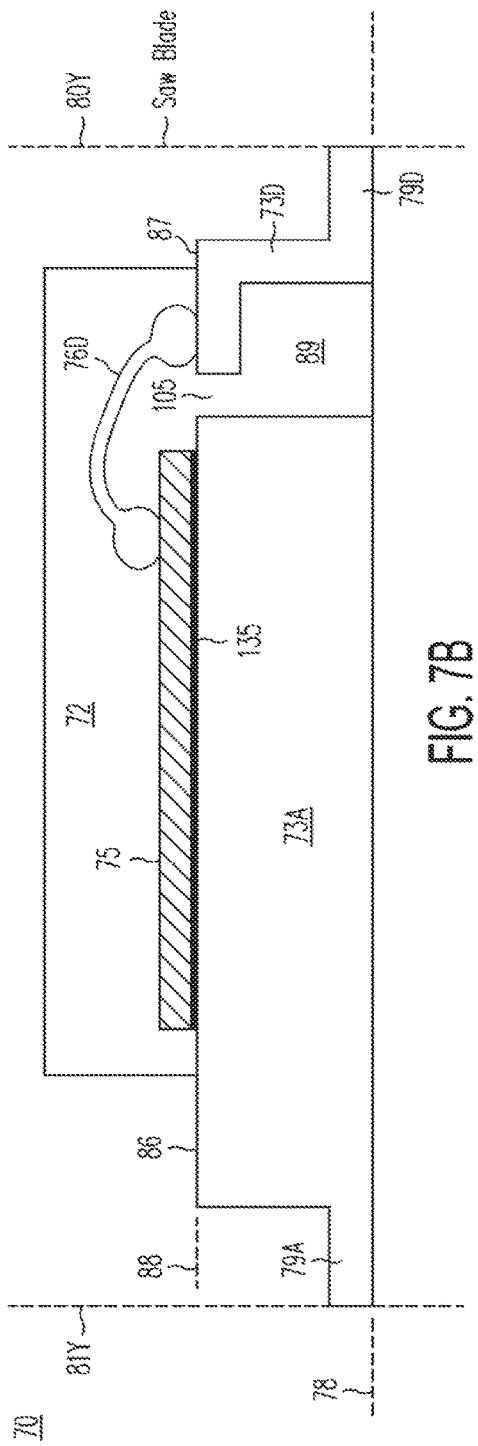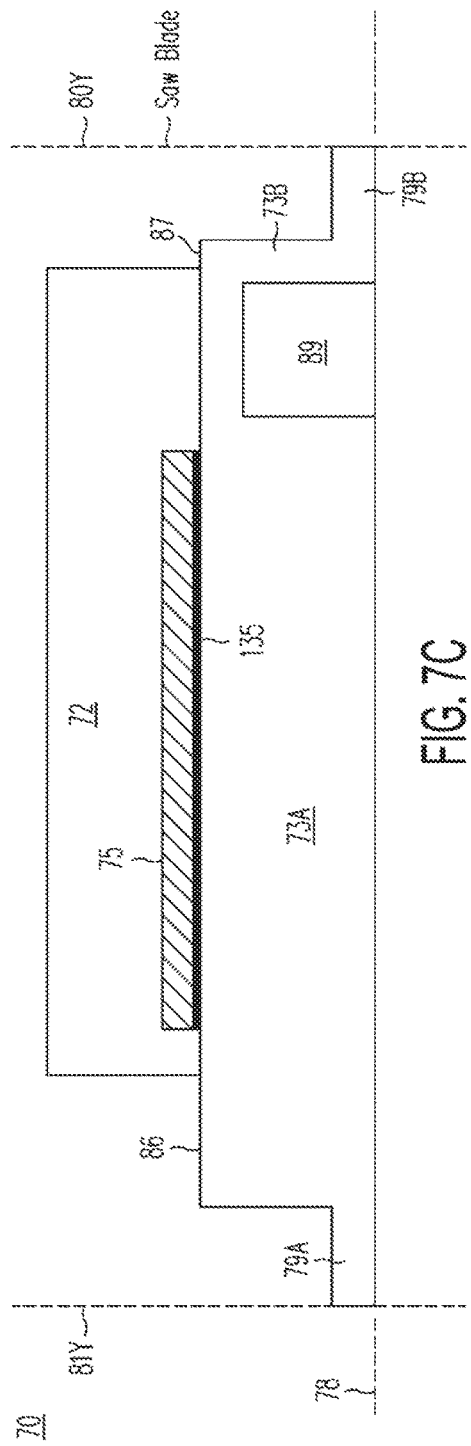
FIG. 7B
FIG. 7C

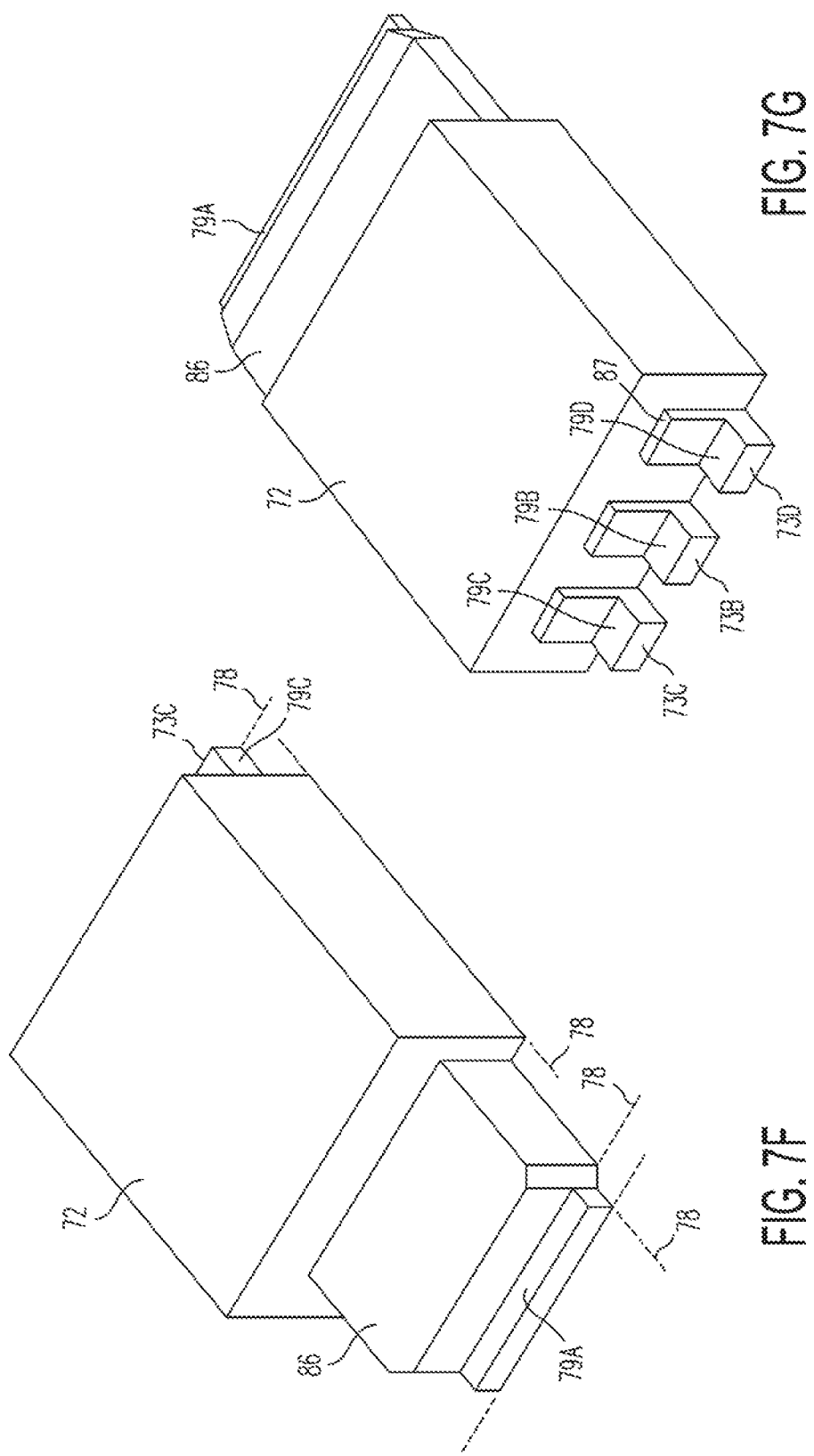

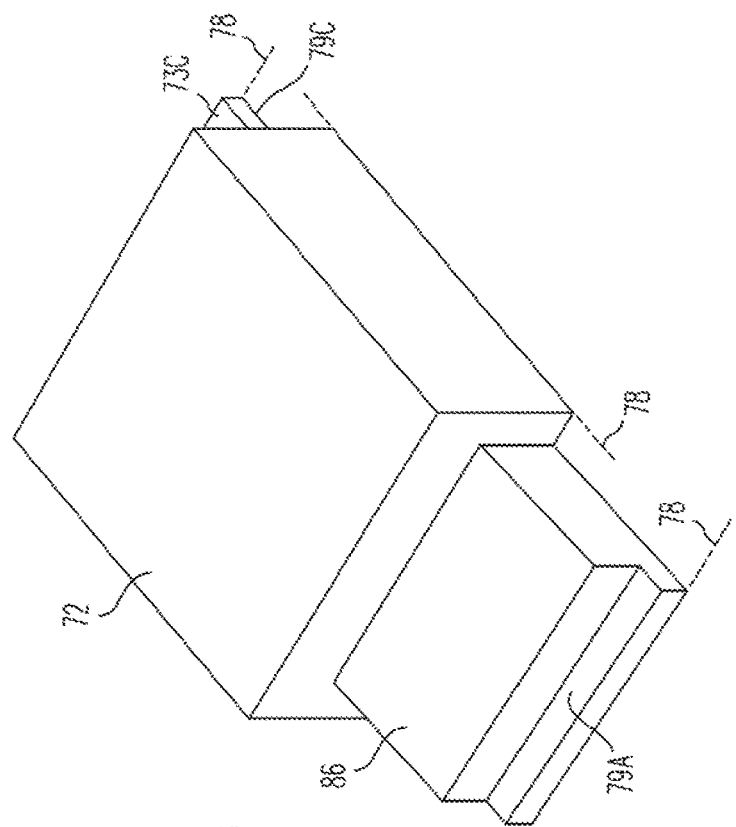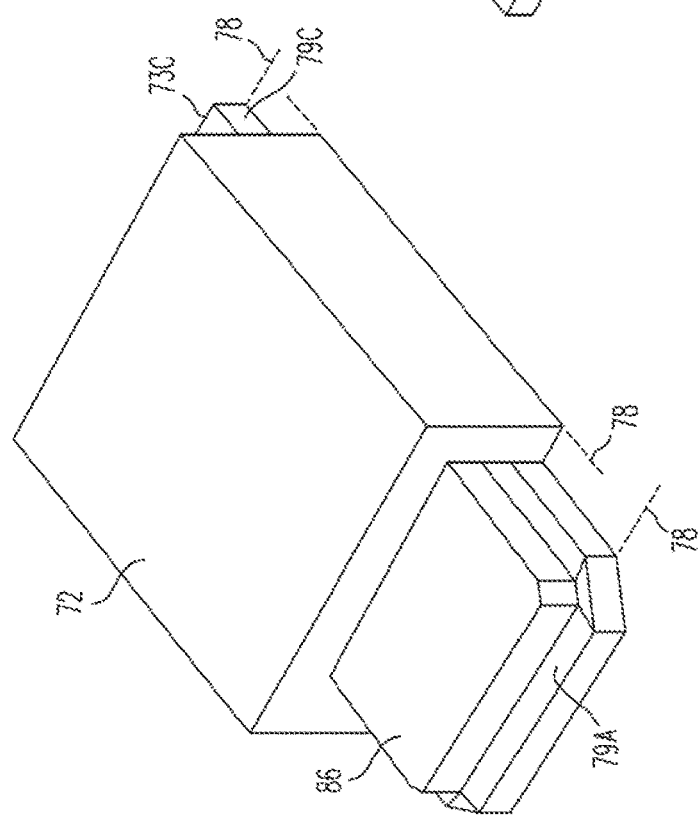

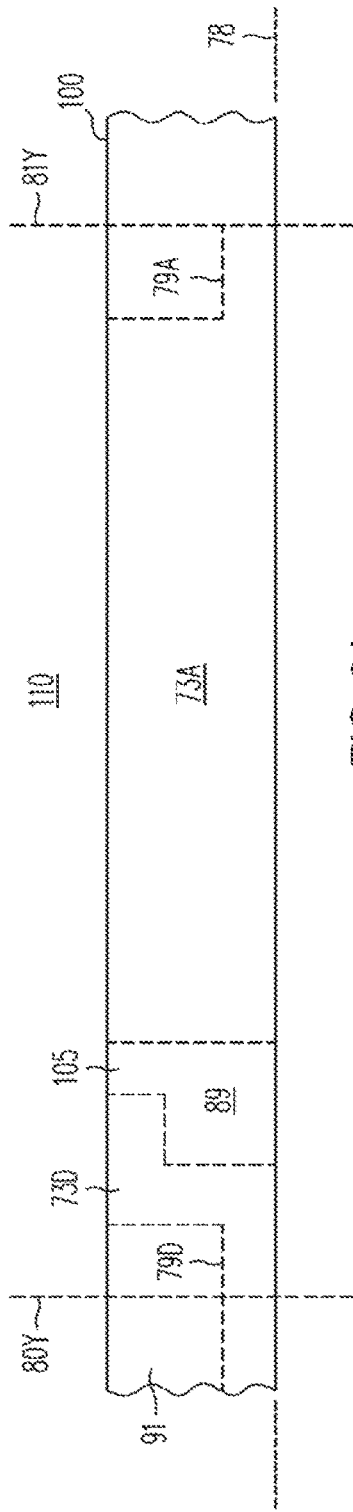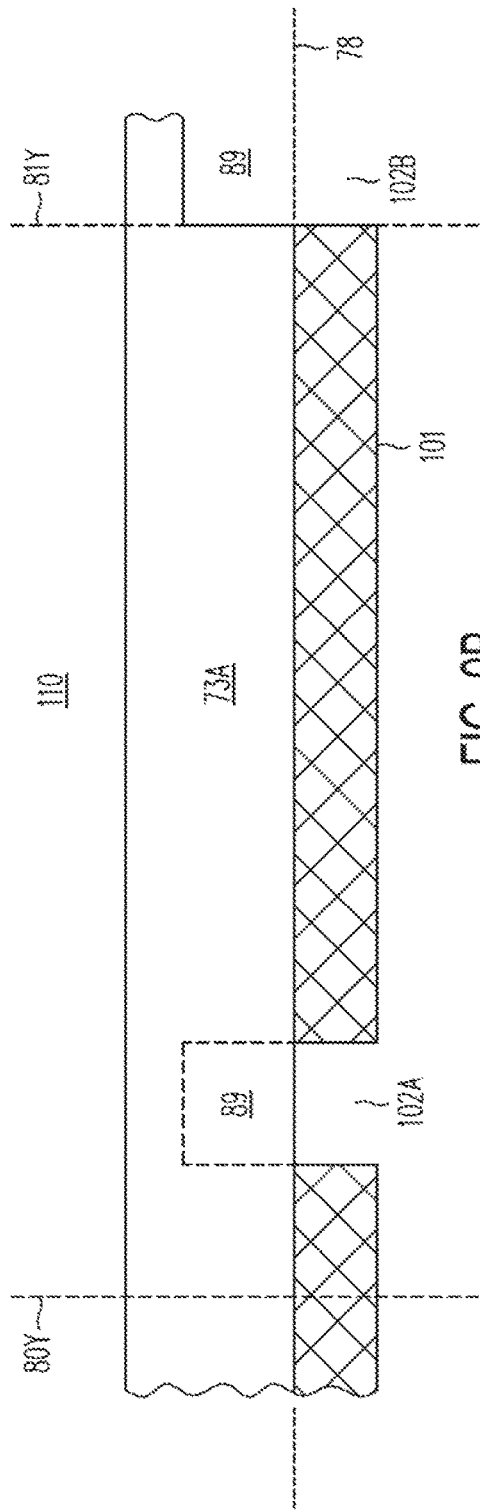

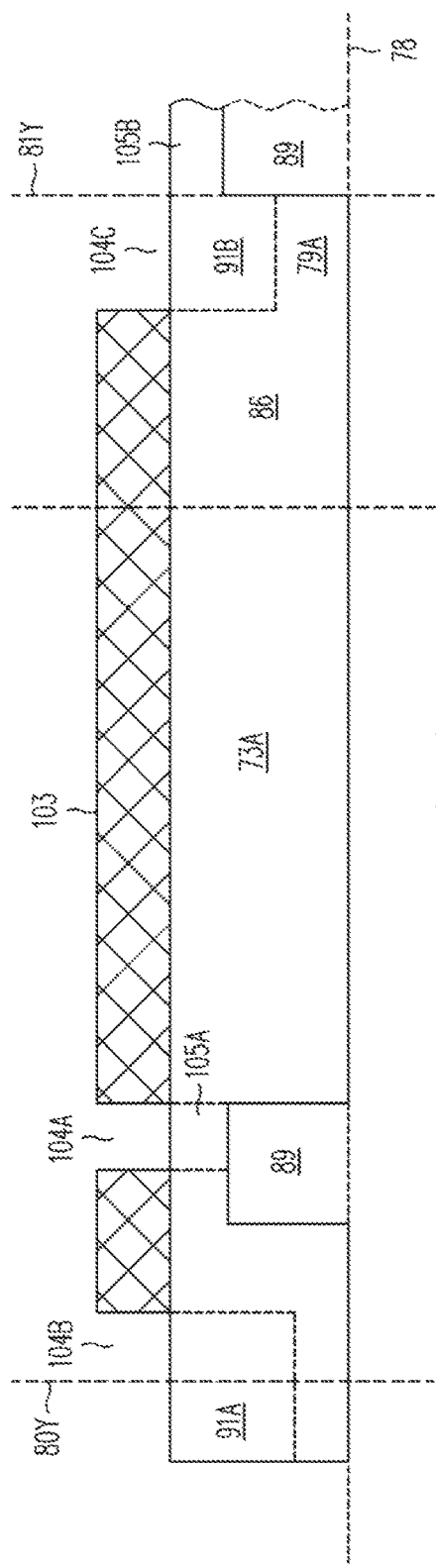
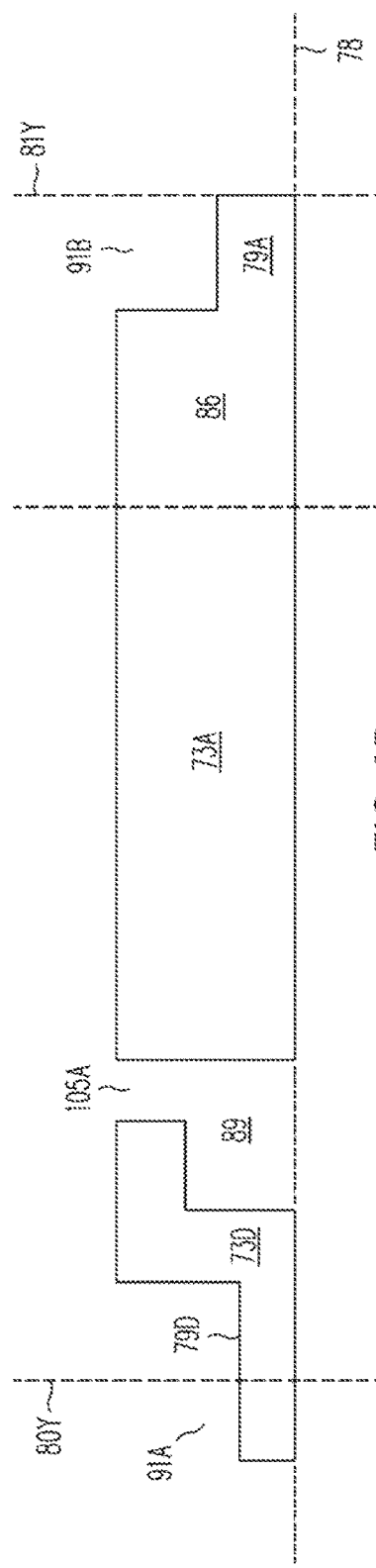

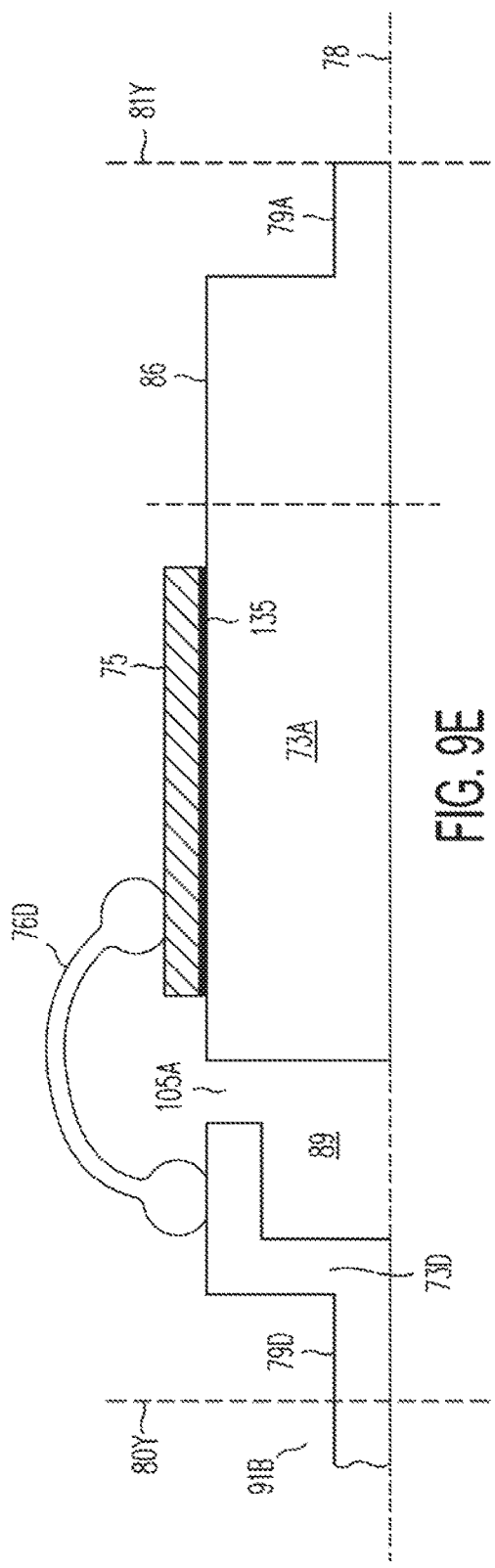
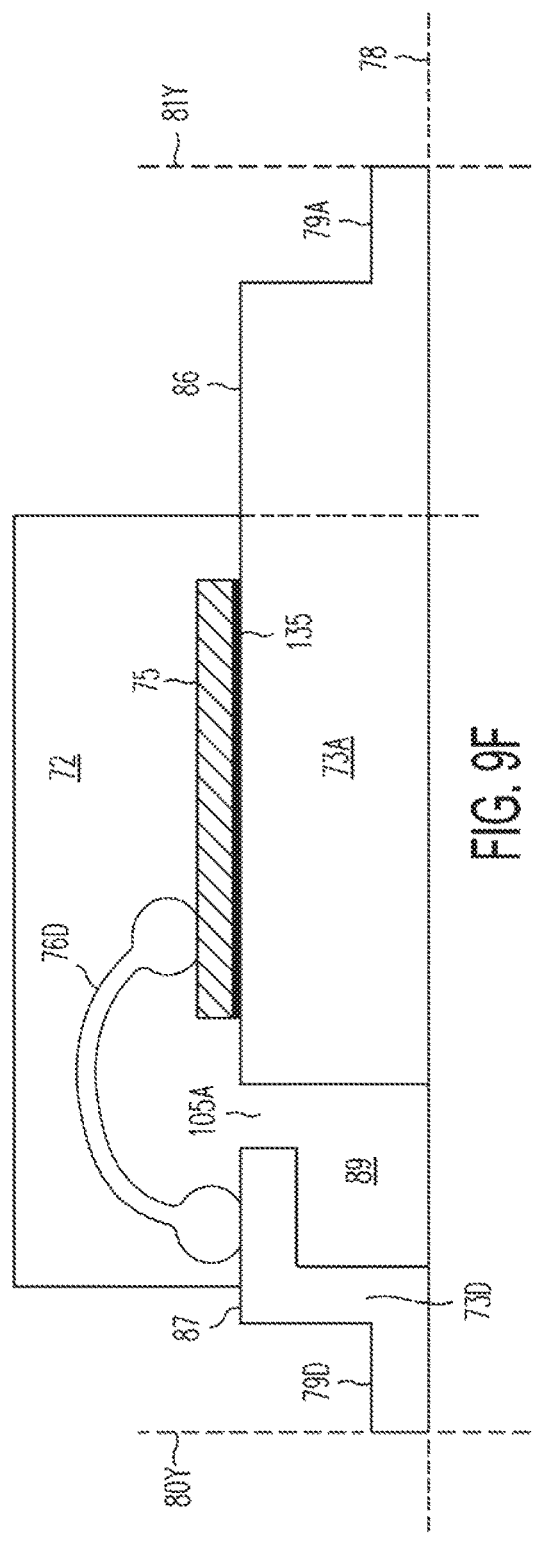

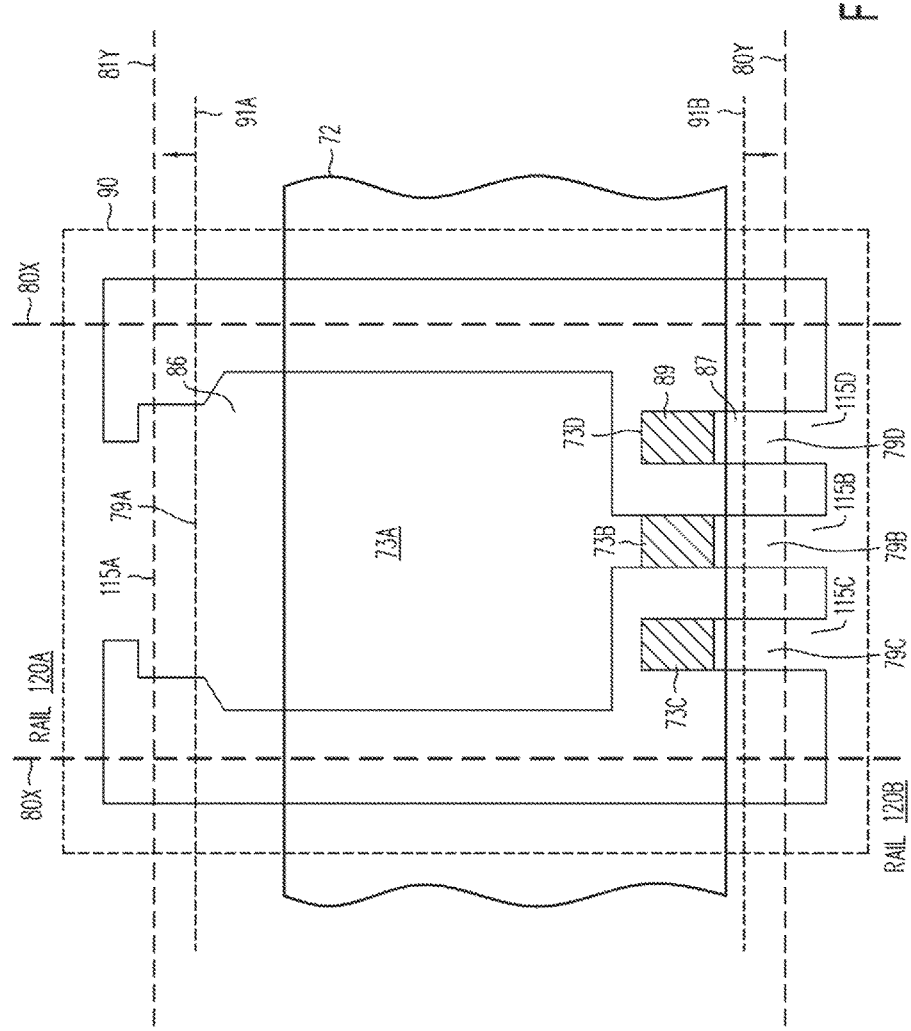

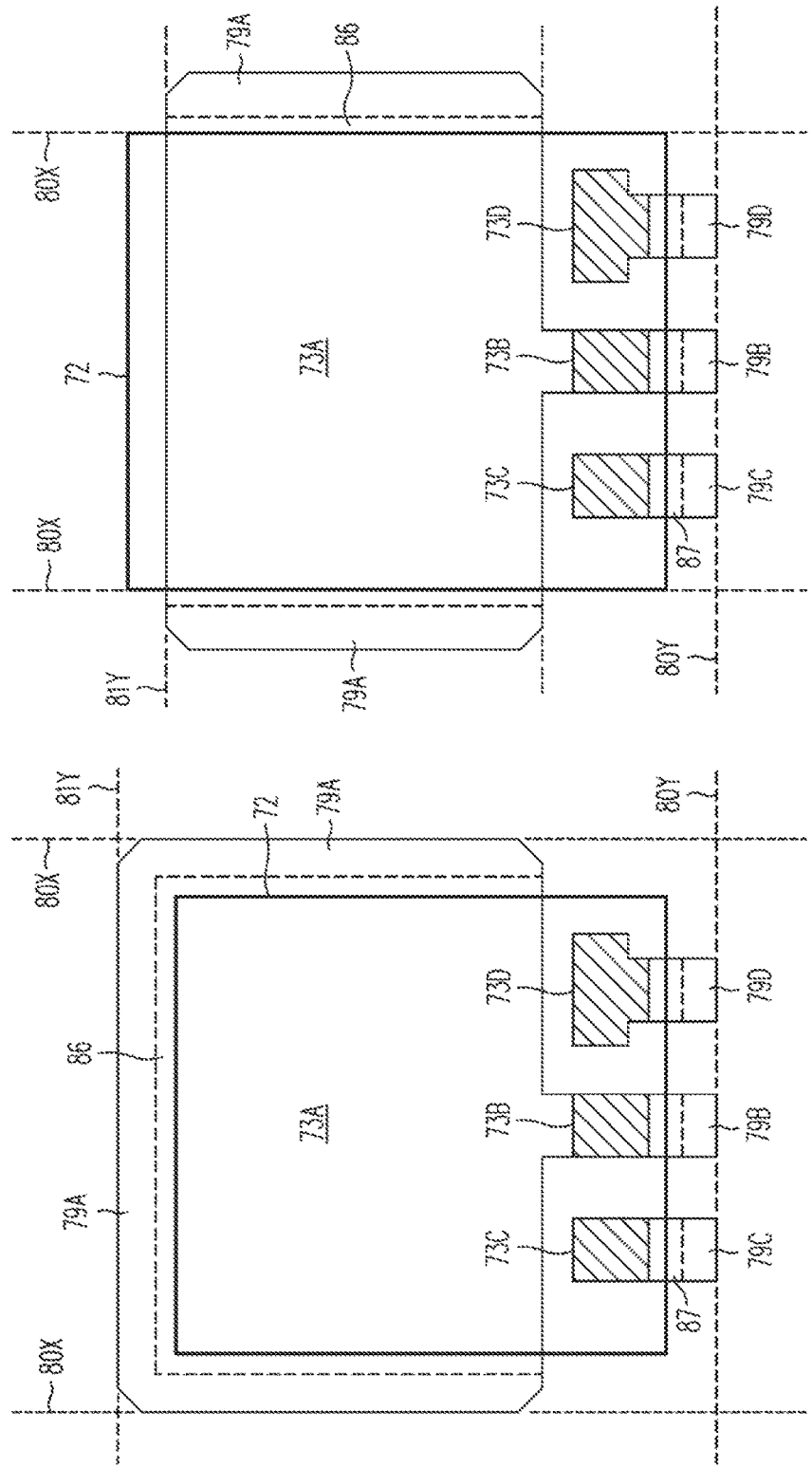

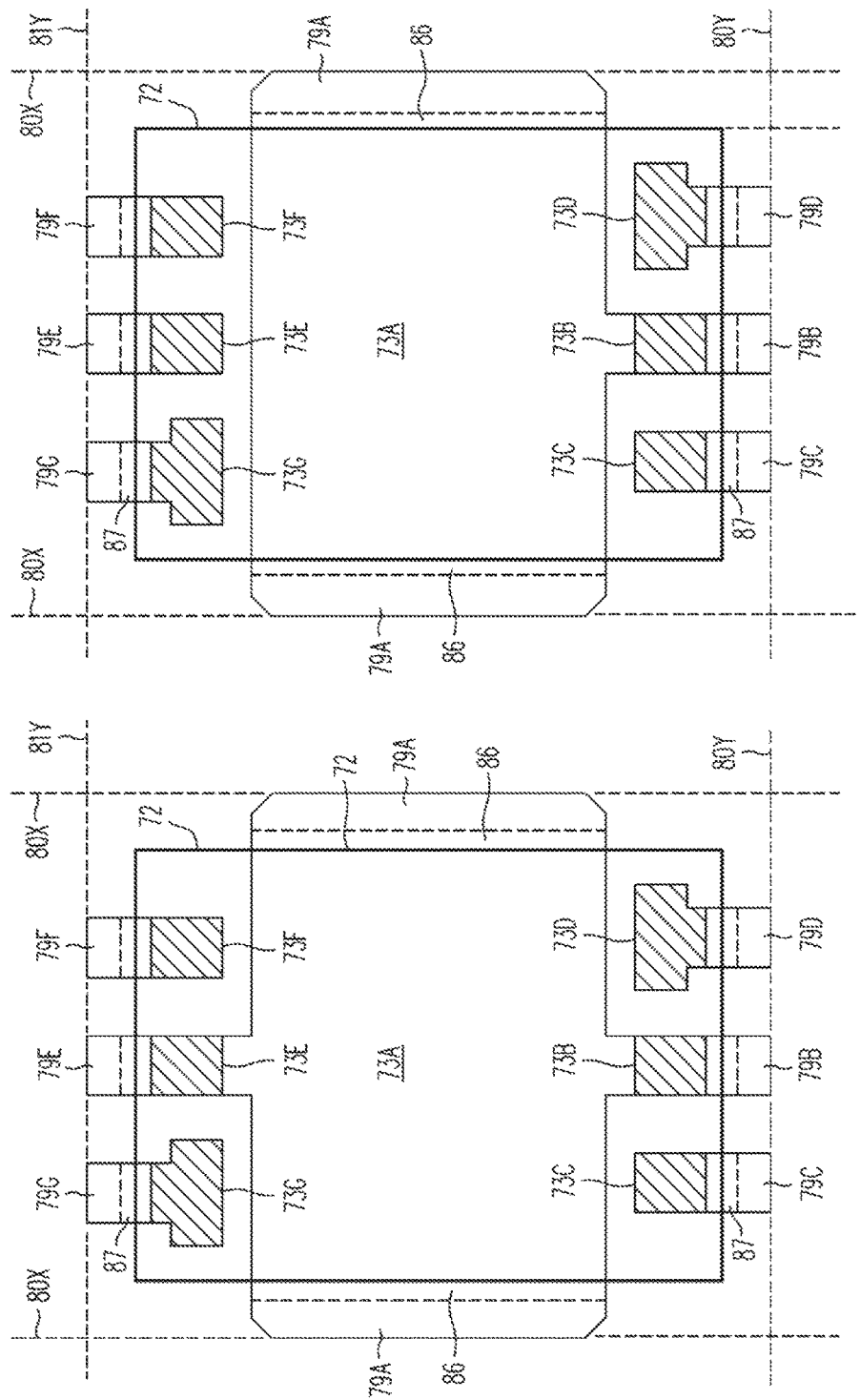

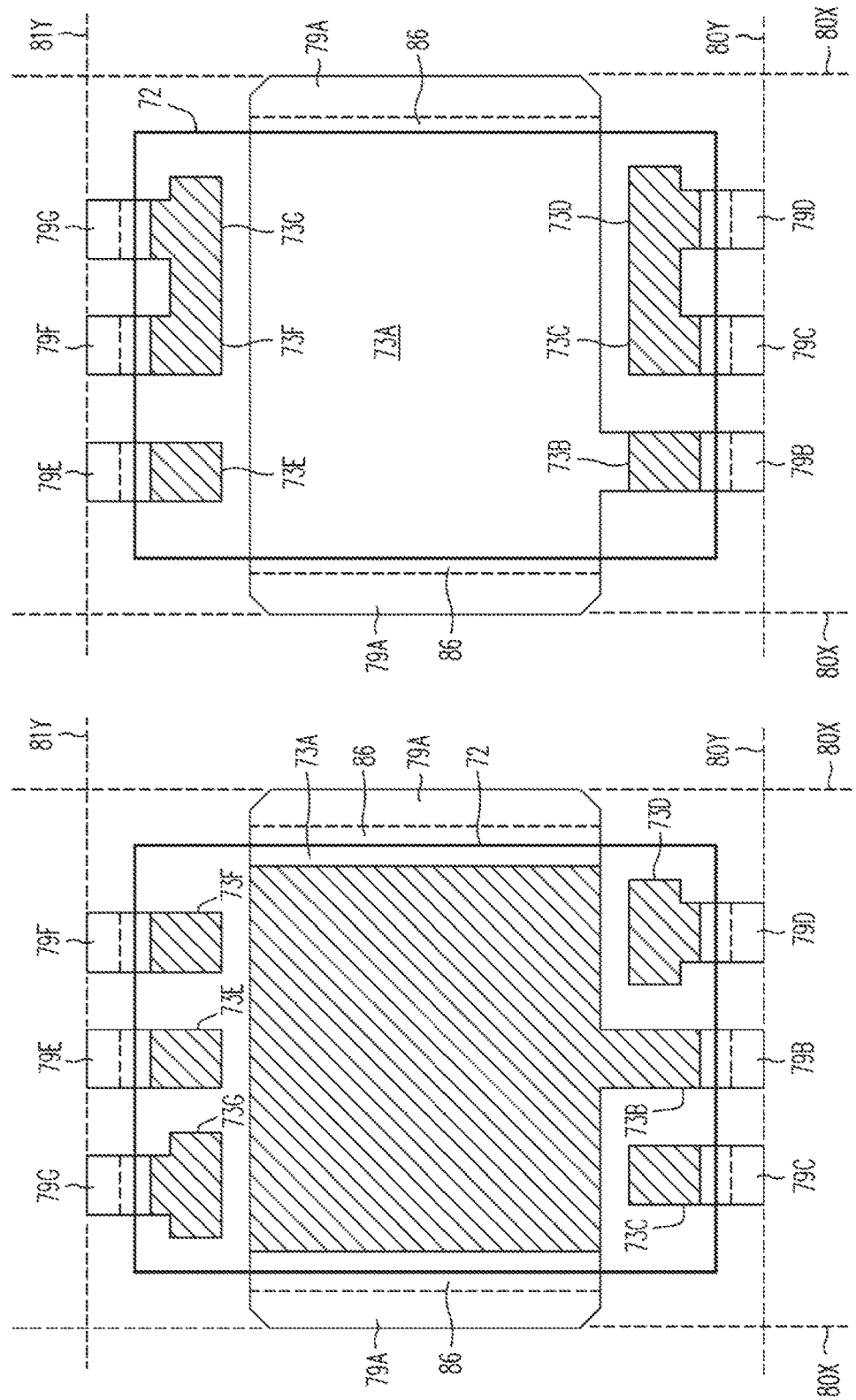

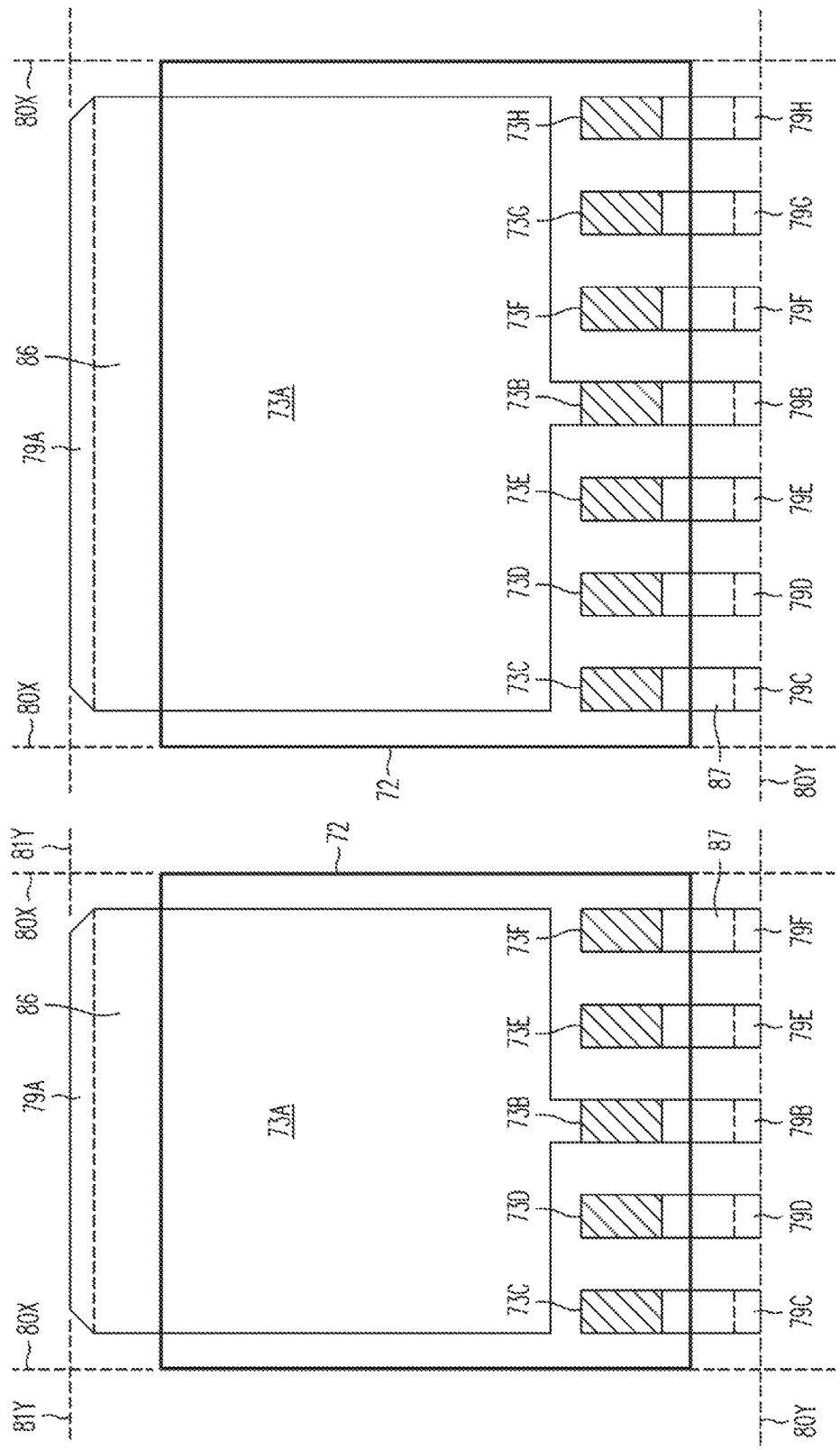

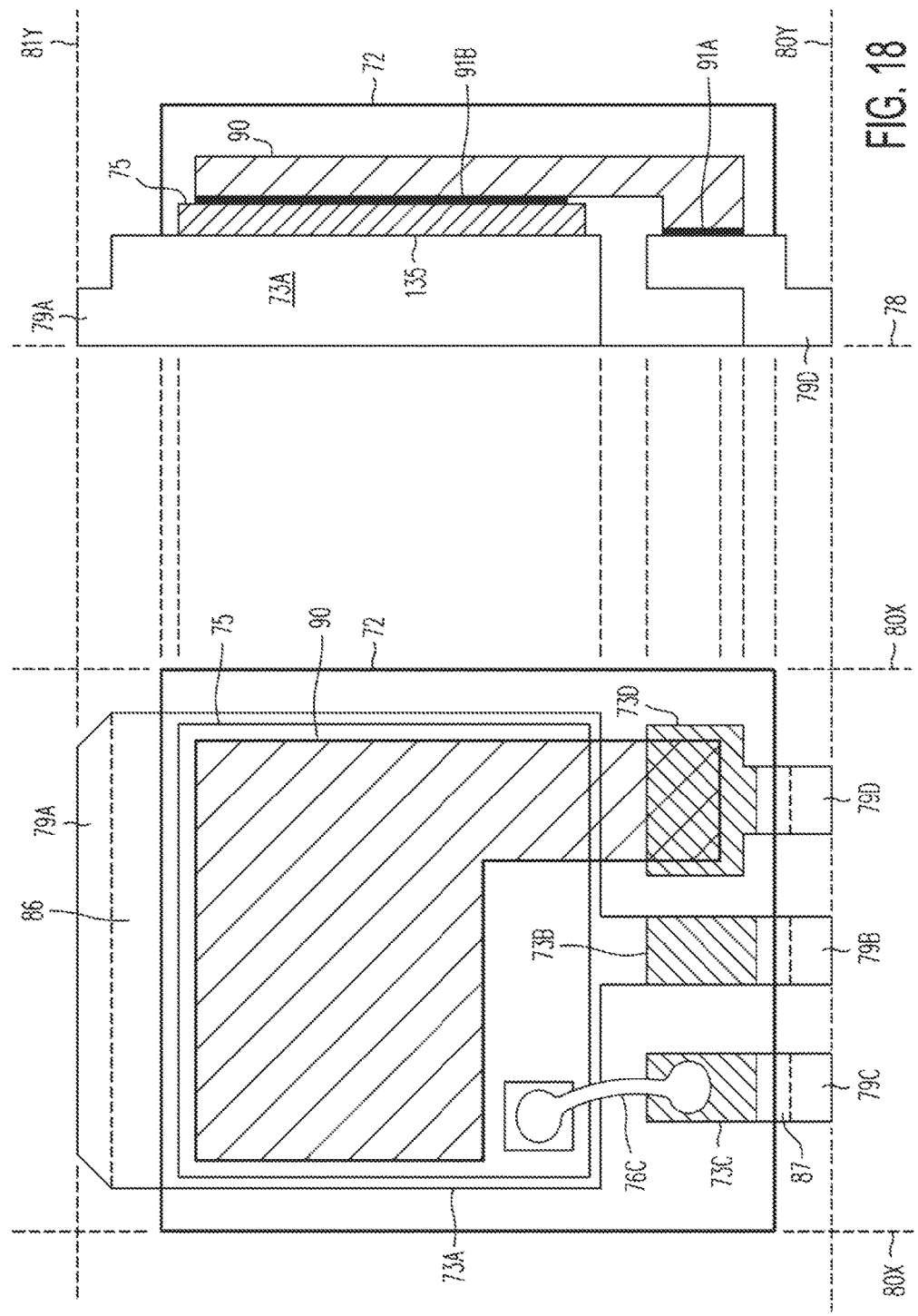

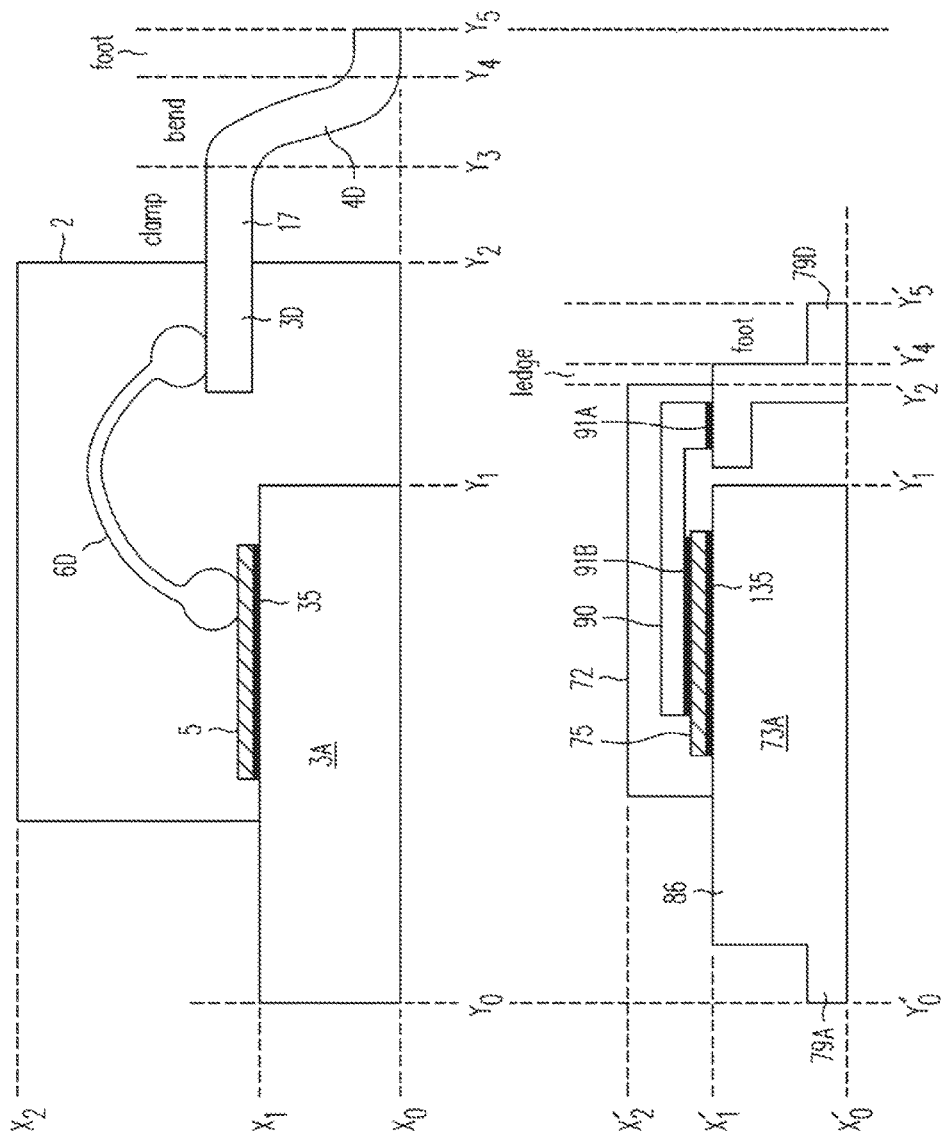

METHOD OF FABRICATING LOW-PROFILE FOOTED POWER PACKAGE

CROSS-REFERENCE TO RELATED APPLICATIONS

This application is divisional of application Ser. No. 14/703,359, filed May 4, 2015, now U.S. Pat. No. 9,620,439, issued Apr. 11, 2017. Application Ser. No. 14/703,359 is a continuation-in-part of application Ser. No. 14/056,287, filed Oct. 17, 2013, now U.S. Pat. No. 9,576,884, issued Feb. 21, 2017, which claims the priority of Provisional Applications Nos. 61/775,540 and 61/775,544, both filed Mar. 9, 2013. Each of the foregoing applications is incorporated herein by reference in its entirety.

FIELD OF THE INVENTION

This invention relates to semiconductor packages for power devices and power integrated circuits.

BACKGROUND

Semiconductor devices and integrated circuits (ICs) are generally contained in semiconductor packages comprising a protective coating or encapsulant to prevent damage during the handling and assembly of the components, during shipping, and when mounting the components on printed circuit boards. For cost reasons, the encapsulant is preferably made of plastic. In a liquid state, the plastic "mold compound" is injected into a mold chamber at an elevated temperature surrounding the device and its interconnections before cooling and curing into a solid plastic. Such packages are commonly referred to as "injection molded".

Interconnection to the device is performed through a metallic leadframe, generally made of copper, conducting electrical current and heat from the semiconductor device or "die" into the printed circuit board and its surroundings. Connections between the die and the leadframe generally comprise conductive or insulating epoxy to mount the die onto the leadframe's "die pad", and metallic bond wires, typically gold, copper, or aluminum, to connect the die's surface connections to the leadframe. Alternatively, solder balls, gold bumps, or copper pillars may be used to attach the topside connections of die directly onto the leadframe.

While the metallic leadframe acts as an electrical and thermal conductor in the finished product, during manufacturing the leadframe temporarily holds the device elements together until the plastic hardens. After plastic curing, the packaged die is separated or "singulated" from other packages also formed on the same leadframe by mechanical sawing. The saw cuts through the metal leadframe and in some instances through the hardened plastic too.

In "footed" semiconductor packages, i.e. packages where the metallic leads or "pins" protrude beyond the plastic and terminate in feet, the leads are then bent using mechanical forming to set them into their final shape. The finished devices are then packed into tape and reels ready for assembly onto customers' printed circuit boards (PCBs).

One example of a footed package 1 is shown in FIG. 1A, comprising semiconductor die 5, plastic 2, bond wires 6C and 6D, metallic leads 38, 3C, 3D and metallic die pad 3A. The metallic leads and lead frame comprise elements from a single lead frame 3 separated during manufacturing. Leads 3B, 3C and 3D are thinner than metallic die pad 3A, exiting plastic body 2 at a height above the bottom surface 8 of the die pad 3A (shown also in FIG. 1B) and must be bent down in curved sections 4B, 4C and 4D so that the non-curved portion of metallic leads 3B, 3C and 3D lie flat or "coplanar" on a PCB with the planar bottom surface 8 of metallic die pad 3A. Such a package is sometimes referred to as a "gull-wing" package owing to its shape of its bent leads.

Such footed packages are manufactured in a large variety of sizes and pin configurations ranging from 3 leads used for packaging transistors and simple ICs such as bipolar junction transistors, power MOSFETs and shunt voltage regulators, to dozens of leads used for packaging integrated circuits (ICs). To date, many billions of products have been manufactured using injection-molded footed plastic packages. Common packages include small transistor packages like the SC70 and SOT23 packages, small outline packages such as the SOP-8, SOP-16 or SOP-24, and for higher pin counts, the footed quad flat pack or LQFP. The LQFP, which can have 64 or more leads per package, apportions its leads in even amounts on each of its four edges while SOT and SOP packages have leads positioned on only two sides.

To accommodate the lead bending process, minimum package heights for the SOP and LQFP typically exceed 1.8 mm. Some packages, including the small outline transistor package such as the SOT23-3, SOT23-5, SOT23-6 and the SOT223, the small chip package such as the SC70, the TSOP-8 thin small outline package, and the TSSOP-8 thin super small outline package, have been engineered for lower profiles, as thin as 1 mm. Below a 1 mm thickness, it becomes difficult to manufacture any of these packages. Even for taller package heights, maintaining good lead coplanarity during lead bending is a constant concern in the volume manufacturing of gull-wing packages.

Accurate forming of leads to tight specifications and tolerances is problematic. Customers consider deformed leads as quality failures, demanding a formal corrective action response and a committed improvement schedule. In extreme cases, manufacturing outside of specified tolerances can result in manufacturing interruptions, triggering financial penalties, vendor disqualifications and even litigation. Poor control of lead bending in manufacturing is not the only limitation of these packages. Because package height is a major consideration in IC packages, the leadframe is limited in thickness, typically to 200 µm or less, and it therefore exhibits relatively poor power dissipation capability because of the inability to effectively spread heat from a the into the printed circuit board or heat sink.

Power packages like the DPAK or D²PAK construction shown in FIG. 1A use much thicker metal, specifically 500 µm, 2.5 times that of integrated circuit packages. As such, IC packages and power packages have diverged in their manufacturing methods over time with ICs becoming more "high tech," requiring sophisticated manufacturing and applicable for use only in expensive reflow printed circuit board (PCB) assembly lines. Power packages in contrast rely on older "low tech" factories and processes, and are generally board mounted in legacy PCB factories using "wave solder" techniques. For the same PCB area, wave solder based factories can manufacture a substantially lower cost—one half to one quarter the cost of reflow assembly factories.

Because of their antiquity, the minimum dimensions and tolerances in power packages tend to be much larger than modern IC packages. Again referring to FIG. 1A, the pin pitch between leads 3C, 3B and 3D is 1.5 mm. In contrast, ICs today commonly employ 0.4 mm center-to-center pin spacing. A cross-sectional view of package 1 taken in a cut line along and through lead 3D is shown in FIG. 1B comprising die pad 3A used as both an electrical and thermal conductor, lead 3D not connected to die pad 3A, semiconductor die 5, conductive bond wire 6D, and molded plastic 2. Die pad 3A includes an upper surface 18 and lower surface 8 and is encased on four sides by molded plastic 2. Die pad 3A also extends laterally beyond molded plastic 2 by a distance 16 and includes an exposed surface along upper surface 18 not encased by molded plastic 2.

Conductive lead 3D exits molded plastic 2 parallel to lower surface 8 at a height above lower surface 8 but below the top surface of molded plastic 2. Conductive lead 3D is mechanically bent into bent portion 4D so that the end of conductive lead 3D sits atop and is coplanar with lower surface 8. A specific metallic portion of the surface of die 5 called the bonding pad is bonded to conductive lead 3D by conductive bond wire 6D, enabling electrical connection from a printed circuit board to the bonding pad. Bond wire 6D may comprise gold, aluminum, or copper. The bonding pad may constitute a specific dedicated metallized area, e.g. a gate pad, or in the case of large power devices may comprise a large array of metal that sits atop a large array of active transistors.

For example, in a vertical power MOSFET or insulated gate bipolar transistor (IGBT), typically the large area top metal of die 5 electrically connects to the source of the device, a smaller bonding pad connects to its gate or input, and the backside of die 5 electrically connects the drain or output of the device directly to die pad 3A through die attach 35, a thin electrically conductive layer of glue or solder. In manufacturing, bond wire 6D must not sag and touch die pad 3A or the device will become electrically shorted. In very high current devices, bond wire 6D may be replaced by a copper "clip", a bent piece of metal contacting the large area conductor's surface on die 5 and the conductive lead 3D. In some package designs, the vertical position of conductive lead 3D is not coplanar with the upper surface 18 of die pad 3A.

During manufacturing, since bending occurs after plastic molding, bent portion 4D much be spaced by lateral distance 17 from molded plastic 2 or permanent damage to molded plastic 2 such as cracking, chipping, and delamination between conductive lead 3D and molded plastic 2 may result. Such damage can result in yield loss during visual inspection, and uncaught, can result in reliability failures. Another source of manufacturing defect can occur if bent portion 4D is bent too much or too little so that the bottom portion of conductive lead 3D is not coplanar with the planar bottom surface 8 of die pad 3A.

A similar, but slightly different cross section shown in FIG. 1C represents the cross section taken as a cut line along and through conductive lead 3B. In this case, lead 3B is physically and electrically connected to die pad 3A. Like conductive lead 3C and others, conductive lead 3B cannot be bent with bent portion 4B being any closer to molded plastic 2 than a minimum lateral distance 17, or molded plastic 2 may be damaged.

An underside plan view of package 1, i.e. the bottom of the package coplanar to planar bottom surface 8, is illustrated in FIG. 1D, where the exposed bottom side of die pad 3A is surrounded on three sides by molded plastic 2 except for the metallic portion 16 or "tab" extending beyond the plastic. The portion of the leads 3C, 3B and 3D not in planar bottom surface 8 are illustrated as dashed lines, including corresponding bent portions 4C, 4B and 4D.

The first step of manufacturing is illustrated FIG. 2A, showing die pad 3A in two different cross sections, the top figure representing the cross section through and along conductive lead 3B, and the lower illustration representing the cross section through and along conductive lead 3C.

Fabrication commences with a solid piece of copper, optionally plated with a thin coating of tin used to improve solderability, which is masked by a protective layer, i.e. mask 30, typically comprising patterned photoresist or an organic material not susceptible to acid. Mask 30 may be applied uniformly and then selectively removed, e.g. using optical exposure to define the areas to be removed, or alternatively may be applied selectively through a stencil mask.

After application and patterning, patterned mask 30 is baked to harden the material. The copper piece is then etched in an acid, e.g. hydrochloric acid comprising $HCL:FeCl_3:H_2O$ in a 4:1:5 mixture, nitric acid comprising $HNO_3:H_2O_2$ in a 1:20 mixture, or ammonia comprising $NH3:H_2O_2$ in a 4:1 mixture. If the copper is pre-plated with a thin layer of tin (Sn), then the tin must first be removed by etching using hydrofluoric acid comprising $HF:HCL$ in a 1:1 mixture, $HF:HNO_3$ in a 1:1 mixture, or $HF:H_2O$ in a 1:1 mixture. A more thorough list of common wet chemical metal etches can be found in semiconductor process textbooks or online at http://www.cleanroom.byu.edu/wet_etch.phtml. The tin and copper may be etched on one side or by immersion in an acid bath. In the case of immersion etching, to prevent unwanted etching and thinning of the leadframe the metal leadframe's backside must be coated by another protective layer. For clarity's sake, this backside protection is not shown in the illustrations but is well known by those skilled in the art of semiconductor packaging.

Returning so FIG. 2A, after etching, the copper forms an L-shape with a thick portion comprising die pad 3A and a thin "diving board" projection designated 3Z. Patterned mask 30 is then removed before processing continues. At this step the cross section shown is identical for both illustrations representing the two aforementioned cross sections. In FIG. 2B, a patterned mask 31 is applied and etching is repeated to etch through a portion of the diving board projection 3Z. In the upper illustration, the diving board projection 3Z is protected, resulting in lead 3B, while in the lower illustration the diving board projection 3Z is separated by etching from die pad 3A resulting in independent lead 3D and gap 32. Lead 3D is held in place by connection to the surrounding lead frame not shown. After etching, protective mask 31 is removed.

Next, as shown in FIG. 2C, semiconductor die 5 is attached to die pad 3A using thin die attach layer 35 comprising either solder or conductive epoxy. In the lower cross section of FIG. 2D, one or more bond wires 6D are bonded atop semiconductor die 5 connecting it to lead 3D. In the upper cross section, no bond wires are required because die attach 35 electrically connects the backside of die 5 to die pad 3A and hence to lead 3B. After wire bonding, plastic molding using transfer molding techniques are then used, as depicted in FIG. 2E, to form molded plastic 2 encapsulating semiconductor die 5, bond wire 6D and other bond wires (not shown), and portions of die pad 3A, leads 3B, 3D and other leads (not shown). In semiconductors, transfer molding is preferred over injection molding because it gives a superior mold with a less flash to remove.

In FIG. 2F leads 3B and 3D are bent by a mechanical "forming" tool, producing bent portions 4B and 4D in their corresponding leads so that the bottom of the leads lies coplanar with the bottom surface 8 of leadframe 3A. Finally the leads are clipped, disconnecting leads 3B and 3D from leadframe 3G. This cutting operation is known as "singulation" because one leadframe containing many packaged dice is cut or broken into separate, "singular" packaged dice. In the bending operation, the mechanical forming tool firmly holds and supports the leads in space 17 to prevent stress from the operation from cracking molded plastic 2. The length of space 17 is determined by the dimension specified by the manufacturer of the mechanical forming tool and cannot be reduced below the minimum specified dimension without risking damage to the package during manufacturing. It is apparent from FIG. 2F that space 17 and bent portions 4B and 4D represent "wasted" PCB area because they do not contain active semiconductor dice and they do represent a useful PCB area, either. Because of its poor area efficiency, this package technology is therefore incompatible with space-sensitive applications such as smartphones and mobile personal electronics.

FIG. 3A illustrates the plan view of a printed circuit board 100 located beneath the conductive traces used for mounting footed package 1 onto the PCB, i.e. the PCB landing pads. The landing pads contain four areas for soldering the components of package 1 onto the PCB: conductor 41C for soldering to the end of lead 3C, conductor 41B for soldering to the end of lead 3B, conductor 41D for soldering to the end of lead 3D, and the fourth area, the large landing pad comprising conductor 41A, for soldering to the bottom of the package's die pad 3A. In the case of leads 3C, 3B and 3D, the solder can be applied from above using wave soldering. Through surface tension, the solder will naturally wet onto the lead and onto the PCB conductive trace. Held in position temporarily either mechanically, by glue or by tape, molten solder affixes itself onto the leads and PCB trace and once cooled hardens into a solid, holding the package in place.

The wave-soldering method of applying solder does not work in the large landing pad of conductor 41A used to connect to the package's die pad 3A. (The dashed line labeled "3A" indicates where die pad 3A is to be positioned.) In this case, a thin piece of solder 45, must be manually deposited onto the PCB before package 1 is placed onto the PCB and die pad 3A must then be soldered into place by heating in an oven before wave-soldering is perforated. During wave-soldering the die pad 3A may float on the solder and move slightly from its target position, making the soldering process somewhat imprecise. To prevent shorts on the PCB, components cannot be mounted too closely to one another. Dashed line 44 represents a "keep out" zone where no other component can be mounted to avoid electrical shorts. Depending on a PCB manufacturer's design rules, this keep out zone 44 can substantially increase the area needed to mount a component on a PCB and greatly reduce the areal packing density of devices.

FIG. 3B illustrates a cross section of package 1 mounted onto a two layer PCB 100. As shown, PCB 100 comprises a lower conductor layer 43A and 43B, upper conductor layer 41A and 41B and an intervening insulating layer with conductive via 42 located within portions of PCB. As shown, die pad 3A is soldered onto PCB conductor 41B by intervening solder layer 45 placed atop the PCB 100 before the package leads are soldered. Solder layer 45 is generally melted before wave soldering. After wave soldering, solder electrically connects lead 3D to PCB conductor 41A. A characteristic of wave soldering is it connects the sides of lead 3D to PCB conductor 41A through solder 34D, but that no intervening solder is present between lead 3D and PCB conductor 41A.

So in "low tech" PCB manufacturing lines, wave soldering is used to solder all the components except for the large die pads of power packages, which instead require solder or solder paste to be manually placed or dispensed prior to power component placement. Such a manual method of placing solder is slow and expensive, and therefore cost effective when used for only for few components. As shown, solder 34A from the wave soldering process also creeps up onto the side of die pad 3A. While such a solder joint may be adequate for carrying the rated current of a power component, it does not insure a low thermal resistance between die pad 3A and PCB conductor 41B, 42, and 43B. As such, the use of solder paste 45 in wave solder manufacturing remains unavoidable when power components are mixed with other ICs.

An alternative PCB assembly method, known as reflow manufacturing, involves printing solder paste across the entire printed circuit board before mounting the components, but this process, while very precise, is slow and therefore expensive, especially since high cost reflow ovens are required to melt the solder in a controlled manner to avoid movement of the components from floating during soldering. Although mandatory in smartphone, tablet, notebook, and mobile device manufacturing, reflow PCB assembly is rarely used in larger low-cost consumer devices such as TVs, automotive electronics, consumer products, white goods, or in power supply modules.

One common device packaged in a package 1 shown in FIG. 1A is a vertical power MOSFET comprising three electrical terminals, the MOSFET drain electrically connected from the backside of semiconductor die 5, a gate input wire-bonded with a single wire to a gate pad on the top side of the die, and a source requiring multiple source bond wires bonded to large topside metal covering most of the die's surface. The electrical equivalent of a power MOSFET mounted in the aforementioned package is illustrated in FIG. 3C where the gate of power MOSFET 47 is connected to conductive lead 3C, the source of power MOSFET 47 is connected by bond wires 6D to conductive lead 3D, and the backside drain is connected to die pad 3A as well as to conductive lead 3B. The high current path includes parasitic inductance 49A of magnitude $L_S$ in the source connection resulting from the source bond wires, and parasitic inductance 49B of magnitude $L_D$ in the drain connection resulting from the package leadframe construction.

In operation, source inductance 49A is a greater concern for several reasons. Firstly, conductive lead 3B can be used to monitor the true drain voltage of MOSFET 47 bypassing the high current flowing through die pad 3A and its parasitic inductance 49B. Source inductance 49A comprising bond wire inductance can be substantial, even where $L_S > L_D$. Unlike in the drain connection, which has both the backside die pad 3A and conductive lead 3B as connections, a separate sense lead to measure the true source voltage of MOSFET 47 is not available in package 1. In circuit operation, however, stray source inductance is problematic and much worse than drain inductance.

Specifically in switching a power MOSFET off, any change in the drain current can cause the source voltage on MOSFET 47 to oscillate. As the source voltage oscillates, the gate-to source voltage may rise and fall above the MOSFET's threshold voltage, turning it on and off multiple times and increasing the switching loss accordingly. In high-speed switching, a separate conductor connecting to the true source of power MOSFET 47 and bypassing source inductance 49A would be advantageous. Unfortunately, such a conductive lead is not possible in present day DPAK and D²PAK packages because conductive lead 3B is used for mechanical support during assembly and necessarily must be tied to die pad 3A.

The role of conductive lead 3B is illustrated in FIG. 4A, where die pad 3A attaches to leadframe bar 38 through lead 3B. So while conductive leads 3C and 3D need not attach to die pad 3A, conductive lead 3B must attach to die pad 3A; otherwise nothing would hold it in place during manufacturing, i.e. during the die mounting, wire bonding, molding, or during trim and forming steps.

The leadframe also illustrates that each die is encapsulated by discrete pieces of molded plastic 2, with multiple cavities required specifically matched to the leadframe. The corresponding mold tool to form the plastic body encapsulating the die and its bond wires is illustrated in FIG. 4B comprising a top mold tool 37B and a lower plate 37A, when pushed together forms a mold cavity for molded plastic 2. Each and any change in the leadframe pitch or package size change requires a new mold to be fabricated, an expensive component requiring involving precision-machined steel molds.

Conventional mold machines are large, typically weighing 200 tons, or 250 tons for the mold press and the mold base. Including the mold cavity tool, the combined cost of such a system is typically of $150,000 USD for the first package type plus another $100,000 USD for each additional package. Newer generation mold machines are even more expensive, even double in price. Moreover, whenever the leadframe and cavity width or pitch of a package is changed, other equipment such as trim and form machines must be modified adding an additional expense of $70,000 USD or more to accommodate the new package form factor.

As such, each mold cavity is a fixed width unique to a specific package and leadframe for example DPAK or D$^2$PAK are different. Using the standardized lead pitch, only three conductive leads per package are possible without modifying the mold tool and mold cavity width. But since, as described previously, the die pad is necessarily tied to the center conductive lead, these standardized packages can only accommodate up to three separate electrical connections.

Devices that utilize packages limited to three electrical connections can be broadly categorized into three types, namely two-terminal devices, three-terminal vertical devices, and three-terminal lateral devices. FIG. 5A illustrates a simplified cross-sectional example of a two terminal vertical device comprising a topside metal 23A, bulk semiconductor material 20 and overlying epitaxial layer 21, backside contact 22 sitting atop a die pad (not shown) on planar surface 18. Topside metallization 23A contacts bond wire 6D in a bonding pad area defined by an opening in passivation layer 48. Beneath passivation layer 48, an oxide or glass layer 25 protects the surface of the device from contamination. In operation, current flows vertically from topside metal 23A through epitaxial layer 21 and substrate 20 to backside metal contact 22. The junctions present in epitaxial layer 21, i.e. the construction of the semiconductor device, are not important in the context of understanding the direction of the main current flow and are not shown. Two-terminal devices generally comprise semiconductor diodes and rectifiers although protection devices and voltage clamps are also examples.

FIG. 5B illustrates a simplified cross-sectional illustration of a three-terminal vertical power device, which as in the previous illustration comprises topside metal 23A, bulk semiconductor material 20 and overlying epitaxial layer 21, along with backside contact 22 sitting atop a die pad (not shown) on planar surface 18. As shown, topside metallization 23A is contacted by bond wire 6D in a bonding pad area defined by an opening in passivation layer 48, representing the high-current connection of the device with the main current flowing vertically from metal 23A to backside metal contact 22.

In areas other than top metal 23A, an oxide layer 25 protects the surface of the device from contamination. In one area, a metal layer 23B sitting atop a portion of oxide layer 25 that is not covered by passivation 48 comprises a second bonding pad contacted by bond wire 6C. This type of connection is used for a gate or input to a device. Examples of three-terminal vertical power devices include, power bipolar transistors, vertical power MOSFETs, insulated gate bipolar transistors (IGBTs), and thyristors. The cross section shown does not include junctions present in each specific device type's construction except to illustrate the main current flow is vertical and a second bonding pad is included as a gate input.

FIG. 6 illustrates the same package can also be used for three-terminal lateral devices whereby the electrical contact to epitaxial layer 45 and substrate 44 by bond wire 6B and top side metal 23B does not constitute the high current path in the device. Instead, the main current in the device flows laterally between bond pad 23D, contacted by bond wire 6D, and bond pad 23A, contacted by bond wire 6A. Because the main current flows through two bond wires instead of only one bond wire, as in the case of vertical devices, the packaging of lateral devices unavoidably suffers from higher parasitic package, i.e. wire resistance. Another difference is that in the case of a lateral device, the main current of the device does not flow vertically, so a backside contact of substrate 44 and the associated backside metal is not required.

In summary, today's high volume power packages had seen little advancement since their inception decades ago. Factory lines for DPAK and D$^2$PAK packages are inflexible, requiring large expenses to accommodate multiple package types. The packages intrinsically are limited to a maximum of three electrical terminals, limiting their applicability to only a few device types. The package's center conductive lead is necessarily shorted to the die pad, further limiting layout options for a semiconductor device. The packages are area-inefficient, with large "keep out" zones and long conductive leads necessary to facilitate lead bending without damaging the molded plastic encapsulant. The large package dimensions and long bond wires contribute to undesirable parasitic resistance and inductance. Lead bending is imprecise, making it difficult to insure good co-planarity of the leads with the bottom of the exposed die pad and adversely impacting PCB assembly yield. And with all the forgoing limitations, the possibility to enhance today's power package design and manufacturing capability to accommodate low profile or multi-lead packages remains problematic both technically and economically.

What is needed is a new generation of power package capable offering low-profile low-inductance and multi-lead capability with superior co-planarity in a flexible, versatile, and cost effective manufacturing line.

SUMMARY OF THE INVENTION

As used herein, the term "power package" refers to a semiconductor package that contains one or more semiconductor power devices and/or one or more power integrated circuits. Power devices are semiconductor devices that carry high currents, typically 1 A to hundreds of amperes. Power devices may conduct high currents at low voltage drops, i.e. comprising devices with low on-resistances, where power dissipation is minimized. Alternatively, power devices may comprise devices that conduct medium to high currents with larger voltage drops, dissipating 1 W to tens of watts of power and requiring heat sinking to conduct the heat away to avoid overheating and damage to the device or its package. Power devices may include bipolar transistors; power MOSFETs of a variety of types and constructions; insulated gate bipolar transistors (IGBTs); or thyristors of a variety of types and constructions including SCRs or silicon-controlled rectifiers. Power integrated circuits comprise one or more power devices integrated with gate drivers and generally with analog and digital control circuitry.

A footed power package of this invention comprises a semiconductor die, a die pad, a lead and a plastic body. In many embodiments the package also comprises at least one heat tab to conduct heat away from the die to the PCB on which the package is mounted. To assist with the heat transfer process, the die pad may be exposed at the bottom surface of the plastic body. The lead is generally X-shaped when viewed in a vertical cross section and comprises a vertical column segment, a cantilever segment and a foot. From a cross sectional view, the cantilever segment projects horizontally inward towards the die pad at the top of the vertical column segment, and the foot projects horizontally outward at the bottom of the vertical column segment. The vertical column segment typically forms right angles and sharp corners with the cantilever segment and with the loot. The bottom surface of the foot is coplanar with a bottom surface of the plastic body.

In some embodiments, the vertical column segment extends horizontally beyond a side surface of the plastic body to form a ledge. In other embodiments, the side surface of the plastic body extends outward beyond the vertical column segment and covers a portion of the upper surface of the foot. All or a portion of the upper surface of the foot is exposed.

In many embodiments the heat tab is an extension of the die pad that protrudes from the plastic body. The heat tab may have a foot similar to the foot of the lead, or the heat tab may have feet on two or three sides. The heat tab may include a hole for bolt mounting. The heat tab may be formed as a series of fingers to increase the length of its peripheral edge relative to its area, which improves thermal resistance for wave soldering. In some embodiments there are two or three heat tabs extending, respectively, from two or three sides of the die pad.

The footed power package of this invention uniquely combines the characteristics of a conventional footed package, shown in FIG. 1B, with those of a leadless package. Thus the vertical edge of the vertical column segment forms a vertical plane and is either covered by or located slightly outside the plastic body. In embodiments wherein the vertical outside edge of the vertical column segment is covered by the plastic body, the foot protrudes outward at the bottom of the side surface of the plastic body. A bottom surface of the foot is flat at least from a location adjacent to the side surface of the plastic body to the end of the foot. These features minimize the horizontal dimensions of the package.

The invention also comprises a process for forming a power package. The process comprises forming a first mask layer on a first side of a metal piece and then partially etching the metal piece through an opening in the first mask layer in an area where the die pad, the cantilever segment of the lead and a gap between the lead and the die pad are to be located. Alternatively, if the die pad is to be exposed at the bottom of the plastic body, the mask layer also covers where the die pad is to be located, and that area is not etched. The partial etch does not cut through the entire metal piece, and a thinned layer of metal remains in the etched areas.

The process further comprises forming a second mask layer on a second side of the metal piece, second mask layer having first and second openings, the first opening in the second mask layer overlying the gap between the die pad and the lead, the second opening in the second mask layer overlying an area where the foot of the lead is to be located. If multiple packages are to be formed from the metal piece, the second opening in the second mask layer may also overlie an area separating adjacent packages.

The metal piece is then etched through the first and second openings in the second mask layer. This etch is continued until the metal is completely removed in the area where the gap between the die pad and the lead is to be located but is only partially removed in the area where the foot is to be located (and in the area separating adjacent packages). The first opening in first mask layer and the second opening in the second mask are vertically offset from each other such than a season of the metal piece remains unaffected by the etch processes. That section will become the vertical column segment of the lead.

Alternatively, a metal stamping process may be used in lieu of the etch processes described above. A first metal stamp is applied to the first side of the metal piece to compress and thin the metal piece where the cantilever segment of the lead and the gap between the die pad and the lead are to be located (and optionally where the die pad is to be located). A second metal stamp is applied to the second side of the metal piece to sever the metal piece where the gap between the die pad and the lead is to be located and to compress and thin the metal piece where the foot of the lead is to be located (and optionally in the area between adjacent packages).

Whether an etching or stamping processes is used, the result is typically a leadframe with multiple die pads, each die pad being associated with a plurality of leads. If the package is to have leads only on two opposite sides of the die pad (a "dual" package), the die pad is typically held in place in the leadframe by means of at least one tie bar. If the package is to have leads on four sides of the die pad (a "quad" package), the die pad is typically left connected to at least one of the associated leads, that is, no gap is formed between the die pad and the at least one of the associated leads in the above-described etching or stamping processes. Either way, the die pad remains connected to the leadframe.

A semiconductor die is then mounted to the die pad, and an electrical connection is made between the die and the lead, typically using wire bonding or flip-chip techniques. Alternatively, the top of the die can be connected to the lead using a clip. The die, die pad and a portion of the lead are encased in a plastic molding compound that is cured to form a plastic body, the plastic body leaving at least a portion of the foot of the lead uncovered. In some embodiments, the plastic body does not cover the vertical outside surface of the vertical column segment, forming a ledge at the top of the lead.

The leadframe and dice are then singulated into separate packages.

A wide variety of footed power packages can be fabricated in accordance with the invention. Since the leads are co-planar with the bottom of the package and the die pad, these leads are referred to herein as "feet" and the resulting packages are referred to as "footed packages". These include:

A footed power package having a plurality of feet on one side and a heat tab on the opposite side. One or more of the feet may extend directly from the die pad. In different embodiments the number of feet varies, for example, from three to five to seven.

A footed power package having a plurality of feet on one side and heat tabs extending from two opposite sides of the die pad at right angles to the feet.

A footed power package having a plurality of feet on one side and a three-sided heat tab extending from the other sides of the package.

A dual footed power package having a plurality of feet on two sides and heat tabs extending from two opposite sides of the die pad at right angles to the leads. Some of the feet may be electrically and mechanically connected to each other or to the die pad.

A footed power package comprising two die pads, feet on opposite sides of the package and heat tabs extending from the die pads on opposite sides of the package at right angles to the feet.

A footed power package having a plurality of feet on three sides and a heat tab on the fourth side. In one embodiment, there are five feet on each of the three sides.

A footed power package having a plurality of leads wherein at least one of the feet is connected to the topside of a die mounted on the die pad by a clip.

The invention will be more fully understood by reference to the following drawings and detailed description.

BRIEF DESCRIPTION OF THE DRAWINGS

In the drawings listed below, components that are generally similar are given like reference numerals.

FIG. 3B illustrates the cross-sectional view of the DPAK power package mounted on PCB.

FIG. 5A illustrates a cross-sectional view of a generic two terminal power device.

FIG. 5B illustrates a cross-sectional view of a generic three terminal vertical power device.

FIG. 7B is a cross-sectional view of the footed power package in a cut line along and through the foot not connected to the die pad.

FIG. 7C is a cross-sectional view of the footed power package in a cut line along and through the die-pad connected foot.

FIG. 7F is a perspective view of the footed power package.

FIG. 7G is another perspective view of the footed power package.

FIG. 8A is perspective view of a footed power package in accordance with the invention having an alternative heat tab design.

FIG. 8B is a perspective view of a footed power package with another alternative heat tab design.

FIG. 9A is a cross-sectional view of a copper leadframe for a footed power package, schematically illustrating the various pieces to be created and removed during fabrication.

FIG. 9B is a cross-sectional view of the leadframe prior to backside etching.

FIG. 9C is a cross-sectional view of the leadframe prior to front side etching.

FIG. 9D is a cross-sectional view of the leadframe after etching.

FIG. 9E is a cross-sectional view of the leadframe after die attach and wire bonding.

FIG. 9F is a cross-sectional view of the leadframe after molding.

FIG. 10A is a plan view of a leadframe for a single-die footed power package in accordance with the invention.

FIG. 13A is plan view of a leadframe for a footed power package with a three-sided heat tab.

FIG. 13B is a plan view of a leadframe for a footed power package with side heat tabs.

FIG. 14A is plan view of a leadframe for a dual-sided footed power package with side heat tabs.

FIG. 14B is plan view of an alternative leadframe for a dual-sided footed power package with side heat tabs.

FIG. 14C is plan view of a leadframe for a dual-sided footed power package with side heat tabs and an isolated die pad.

FIG. 14D is plan view of an alternative leadframe for a dual-sided footed power package with side heat tabs.

FIG. 16A is a plan view of a leadframe for a 5-lead footed power package.

FIG. 16B is a plan view of a leadframe for a 7-lead footed power package.

FIG. 18 is a plan and cross-sectional view of a leadframe for a footed power package with a clip topside connection.

FIG. 19 is a cross-sectional view comparing a conventional power package and a footed power package according to the invention.

DESCRIPTION OF THE INVENTION

In order to advance today's power package technology, certain fundamental changes must be made in the manufacturing process, package and leadframe design. Improvements desirable in a next generation power package include
 Guaranteed co-planarity of leads and the back of an exposed die pad
 Solderable, using both wave soldering and reflow PCB manufacturing
 Reasonably low thermal resistance without using solder preplaced under heat tab
 Low-profile capable
 Reduced inductance, shorter lead and bond wire length
 Good PCB areal efficiency, i.e. large die area for a given PCB footprint
 Flexible pin out, with no requirement to tie the leads to the die pad
 Flexible number of conductive leads, available on one two or three sides
 Elimination of lead bending (forming) machines
 Minimal expense for mold cavity tools Using the invention disclosed herein, such features and benefits are readily available with minimal or no new investment in retooling a production line, including the production lines used to manufacture of high volume DPAK and D²PAK packages. The methods disclosed herein as applied to integrated circuit packages are disclosed in the above-referenced U.S. Pat. No. 9,576,884. Power packages are commonly used to package power devices or power integrated circuits. While the power packages may be used for non-power applications, in general power packages have fewer leads, lower thermal resistance, and higher material costs than IC packages with similar pin counts and are therefore generally used only to package power devices and power integrated circuits.

Power devices are semiconductor devices that carry high currents, typically 1 A to hundreds of amperes. Power devices may conduct high currents at low voltage drops, i.e. comprising devices with low on-resistances, where power dissipation is minimized. Alternatively power devices may comprise devices that conduct medium to high currents with larger voltage drops, dissipating 1 W to tens of watts of power and requiring heat sinking to conduct the heat away to avoid overheating and damage to the device or its package. Power devices may include bipolar transistors; power MOSFETs of a variety of types and constructions; insulated gate bipolar transistors (IGBTs); or thyristors of a variety of types and constructions including SCRs or silicon-controlled rectifiers. Power integrated circuits comprise one or more power devices integrated with gate drivers and generally with analog and digital control circuitry.

Figure 1A:
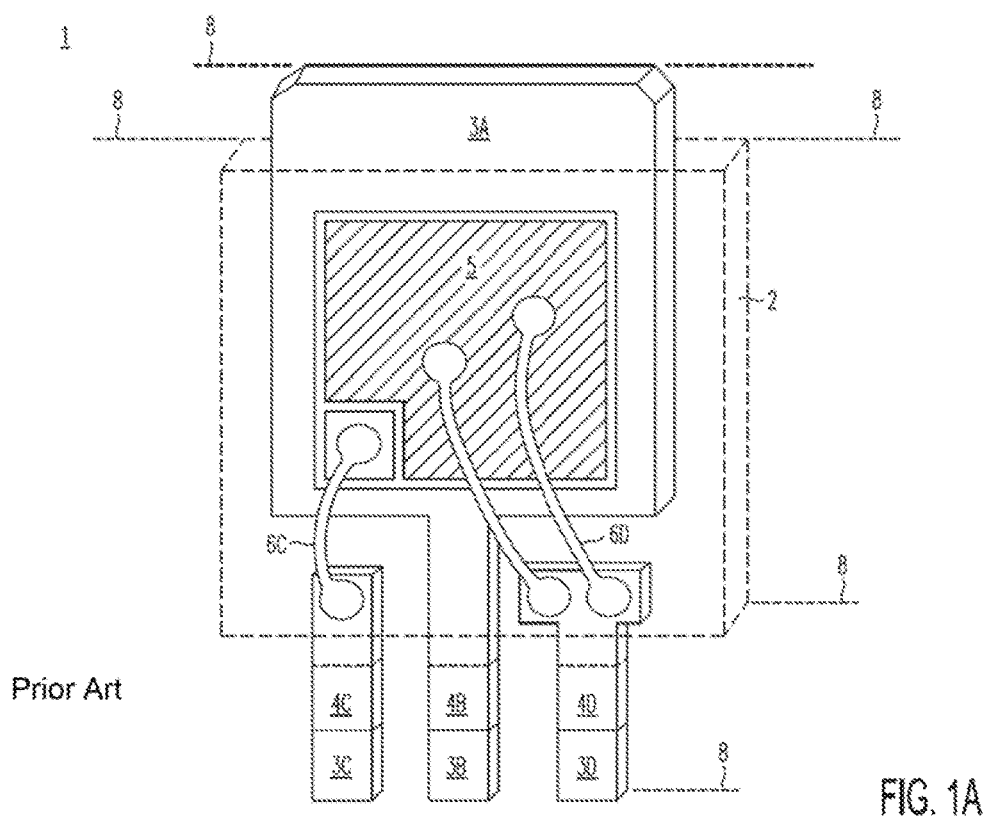
FIG. 1A is a plan view of a power package typical of a prior art DPAK or D2PAK type construction.
Figure 1B:
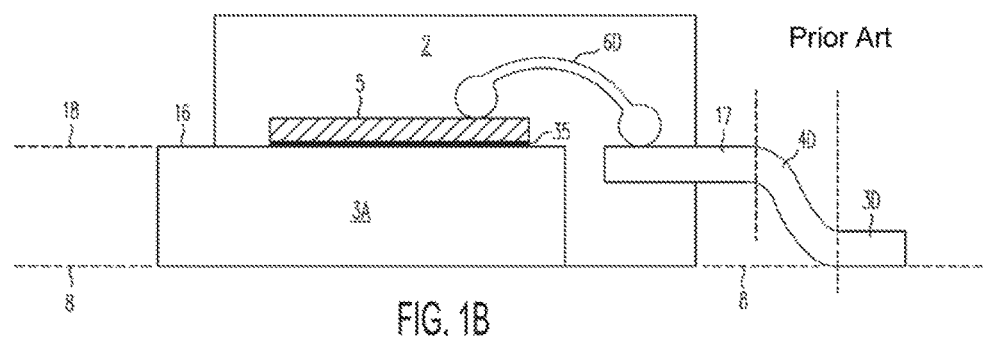
FIG. 1B is a cross-sectional view of the prior art DPAK power package in a cut line along and through the independent lead.
Figure 1C:
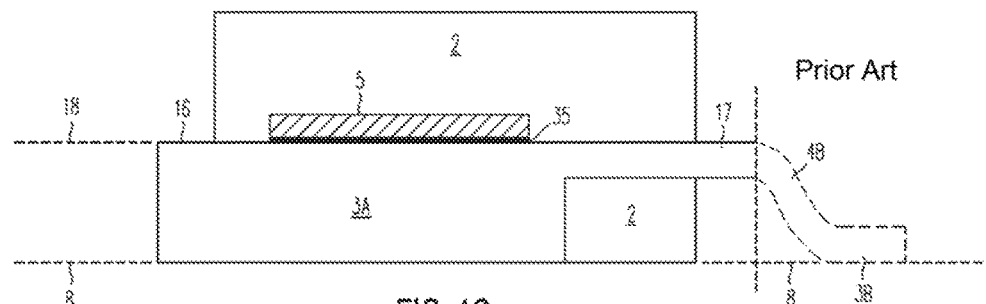
FIG. 1C is a cross-sectional view of the prior art DPAK power package in a cut line along and through the connected lead.
Figure 1D:
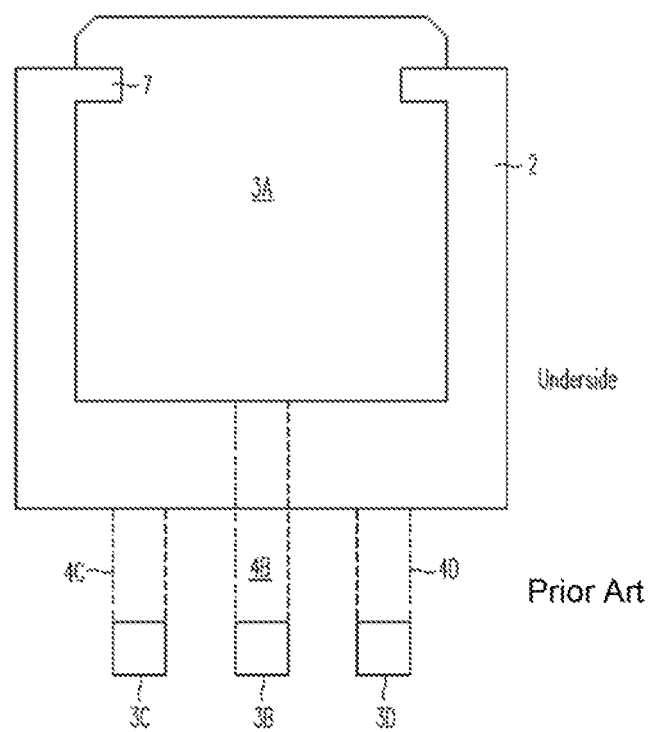
FIG. 1D is an underside plan view of the prior art DPAK power package.
Figure 2A:
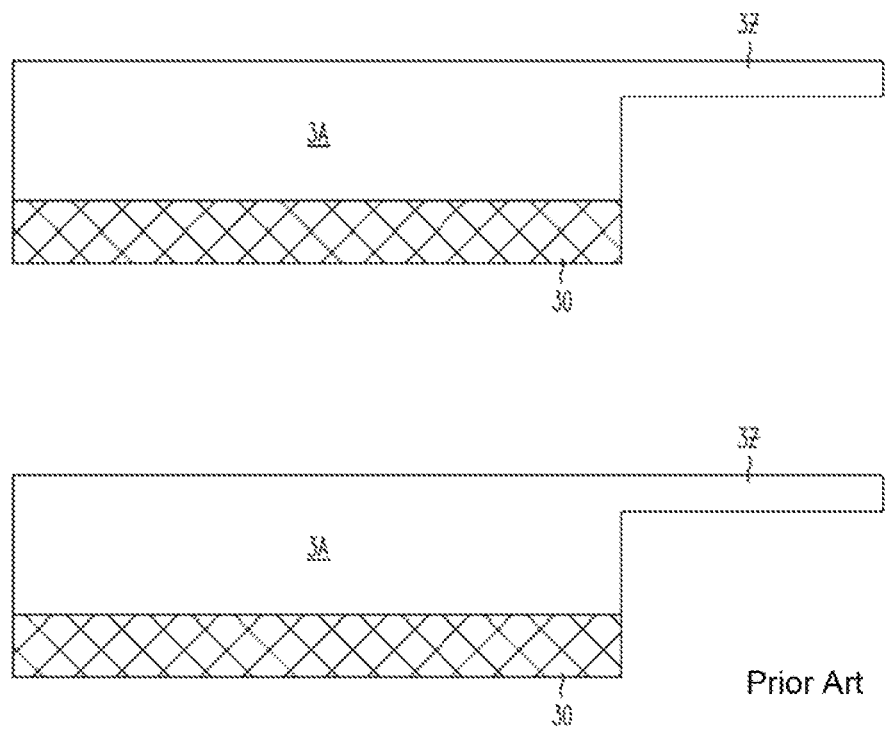
FIG. 2A illustrates connected and independent lead cross sections of a prior art DPAK during manufacture after backside etch of copper leadframe.
Figure 2B:
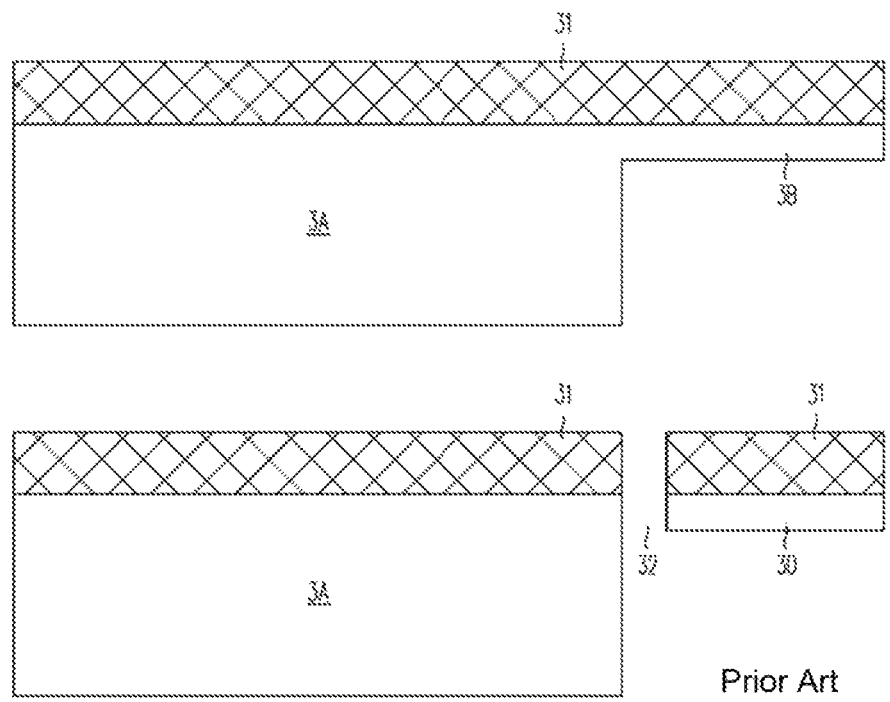
FIG. 2B illustrates the same DPAK cross sections after topside etch.
Figure 2C:
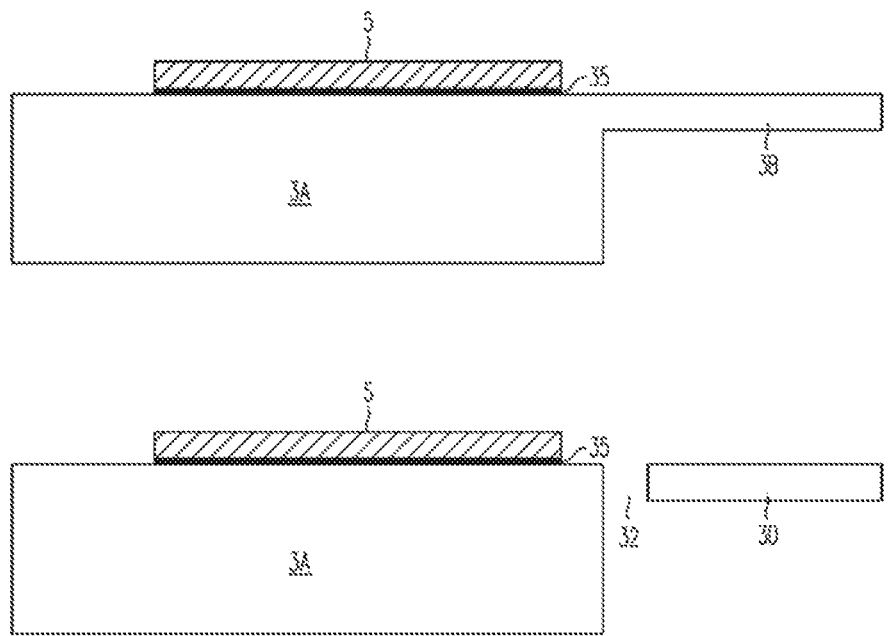
FIG. 2C illustrates the same DPAK cross sections after die attach.
Figure 2D:
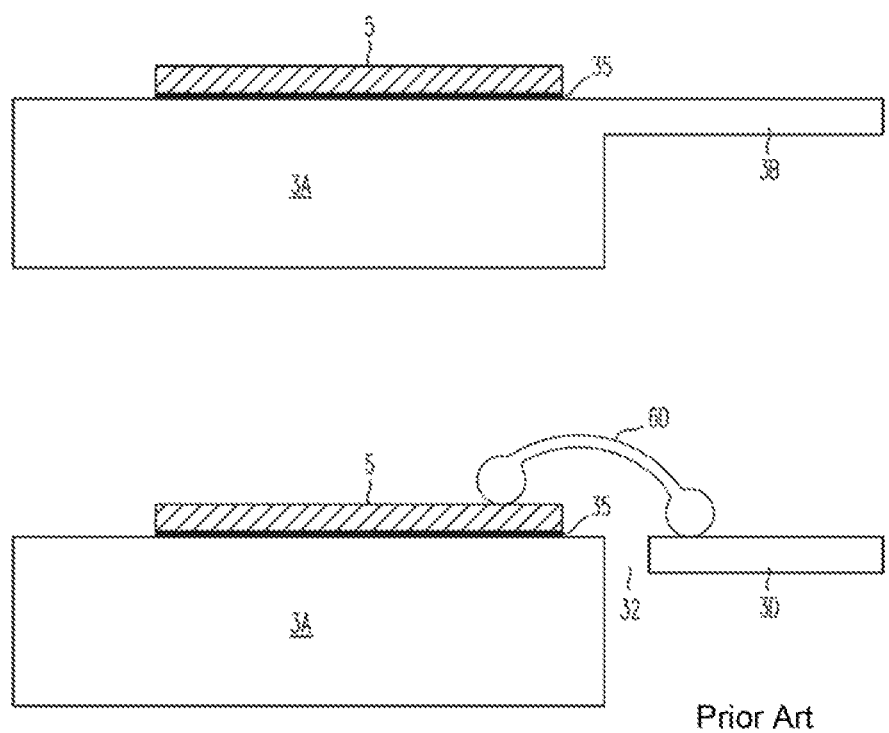
FIG. 2D illustrates the same DPAK cross sections after wire bonding.
Figure 2E:
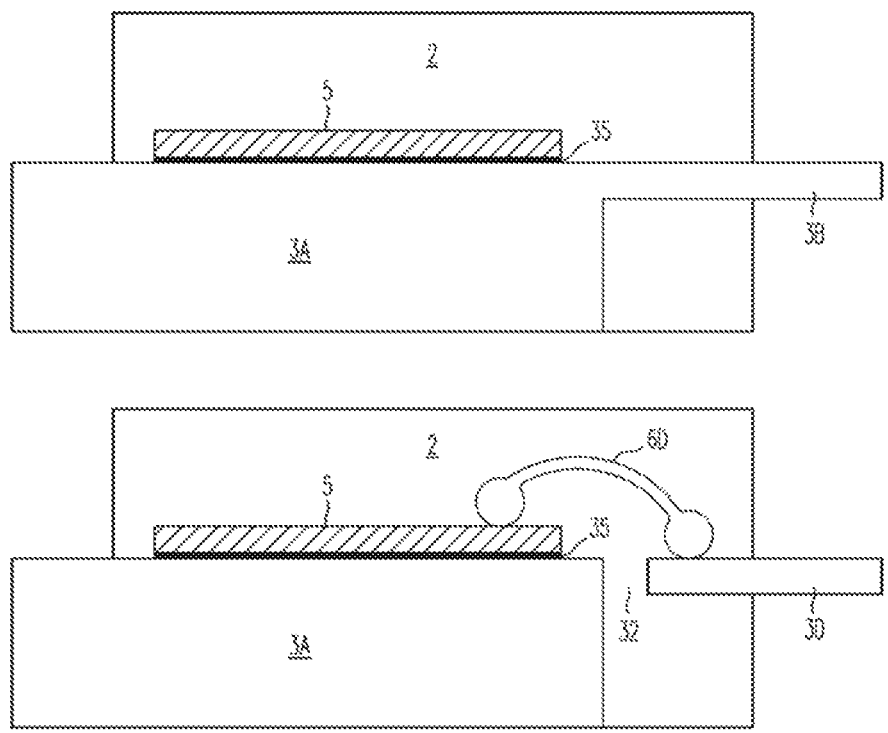
FIG. 2E illustrates the same DPAK cross sections after molding.
Figure 2F:
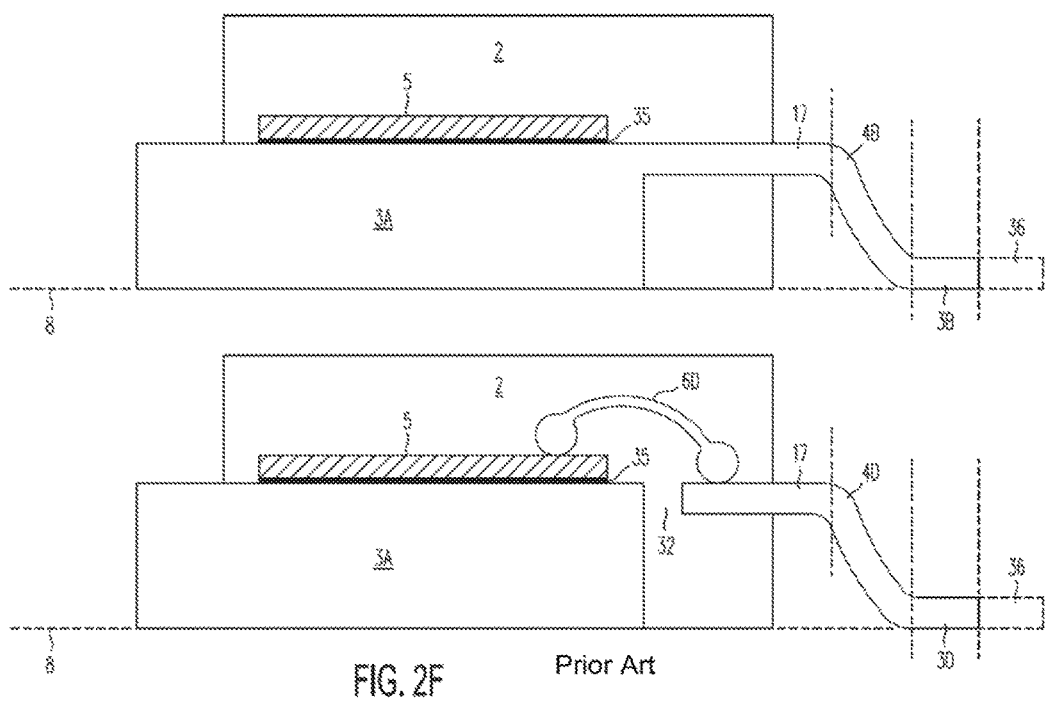
FIG. 2F illustrates the same DPAK cross sections after lead bending.
Figure 3A:
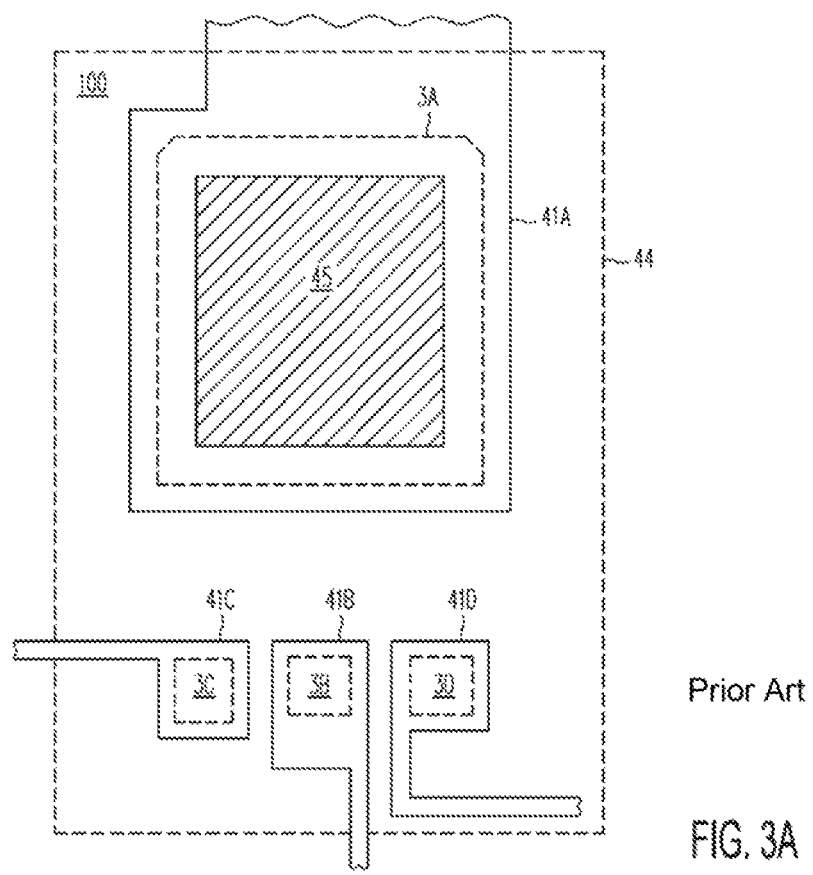
FIG. 3A illustrates a plan view of a PCB layout for mounting a prior art DPAK power package.
Figure 3C:
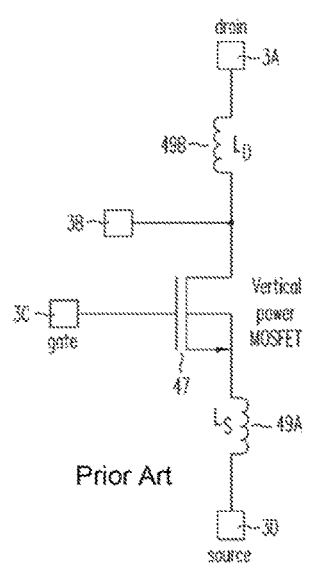
FIG. 3C illustrates an equivalent circuit of the power MOSFET mounted in DPAK power package, showing the parasitic package inductance.
Figure 4B:
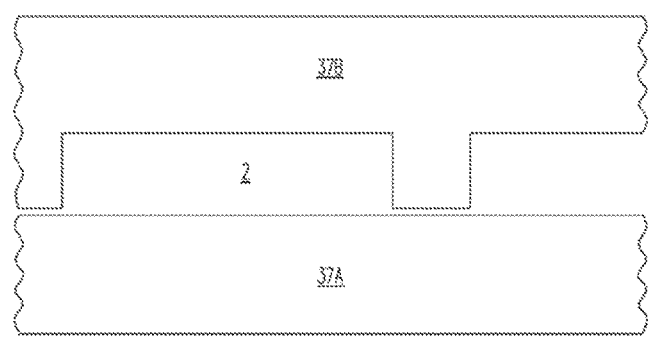
FIG. 4B illustrates a cross-sectional view of a mold tool for a DPAK power package.
Figure 4A:
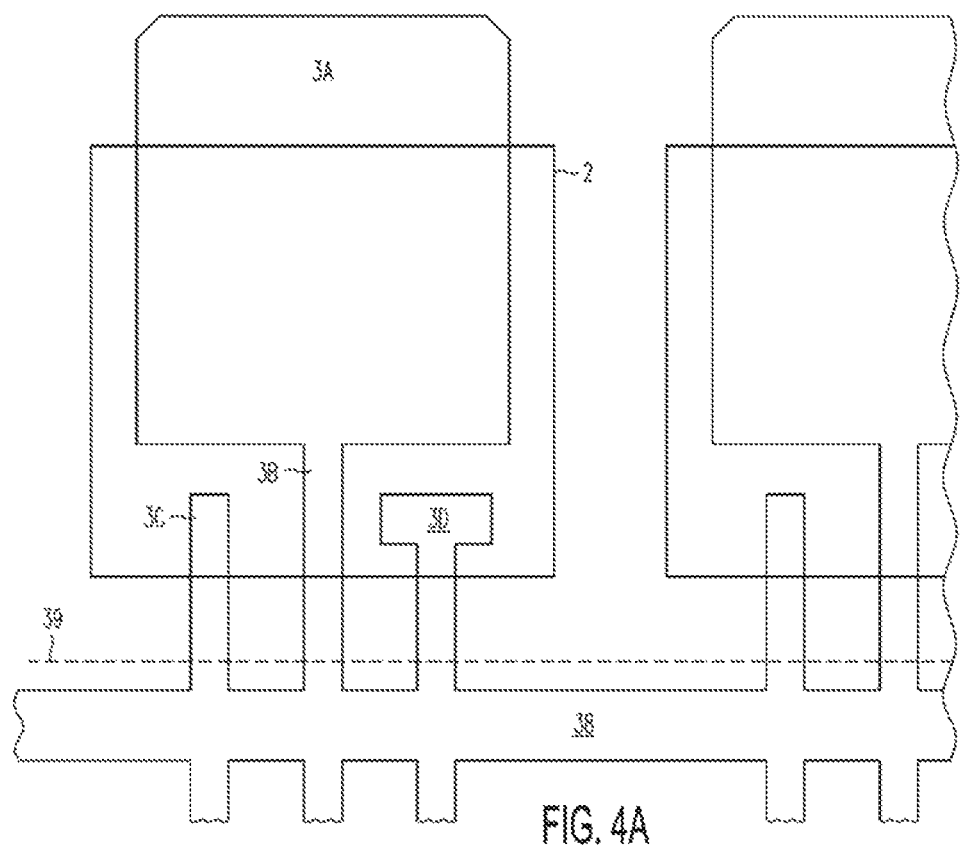
FIG. 4A illustrates a plan view of a leadframe for a DPAK power package.
Figure 6:
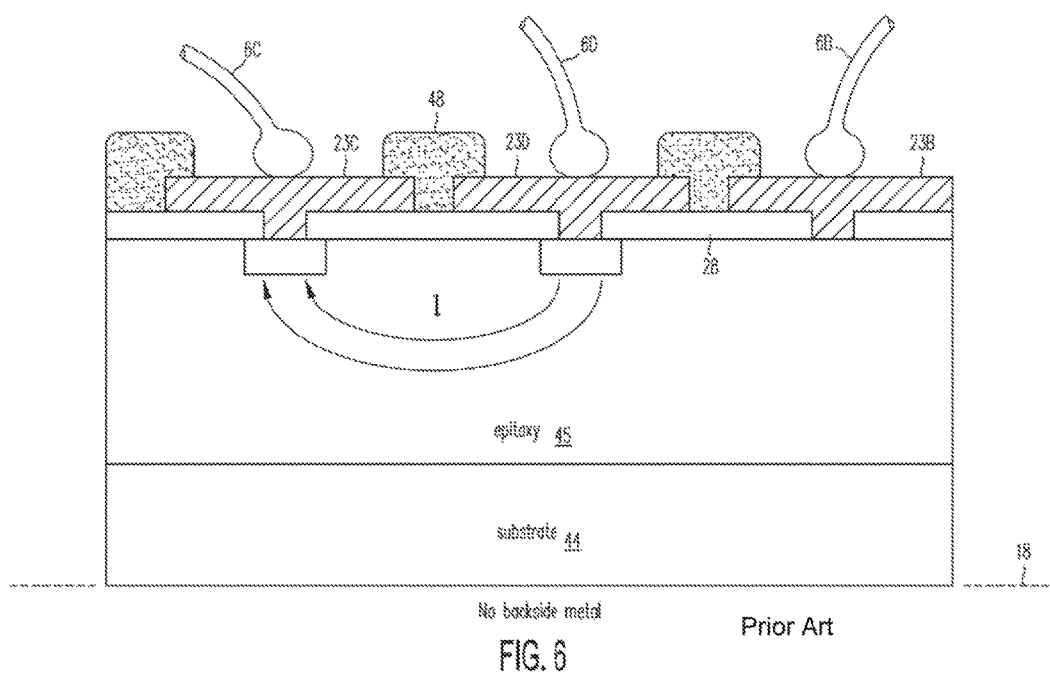
FIG. 6 illustrates a cross-sectional view of a generic three terminal lateral power device.
Figure 7A:
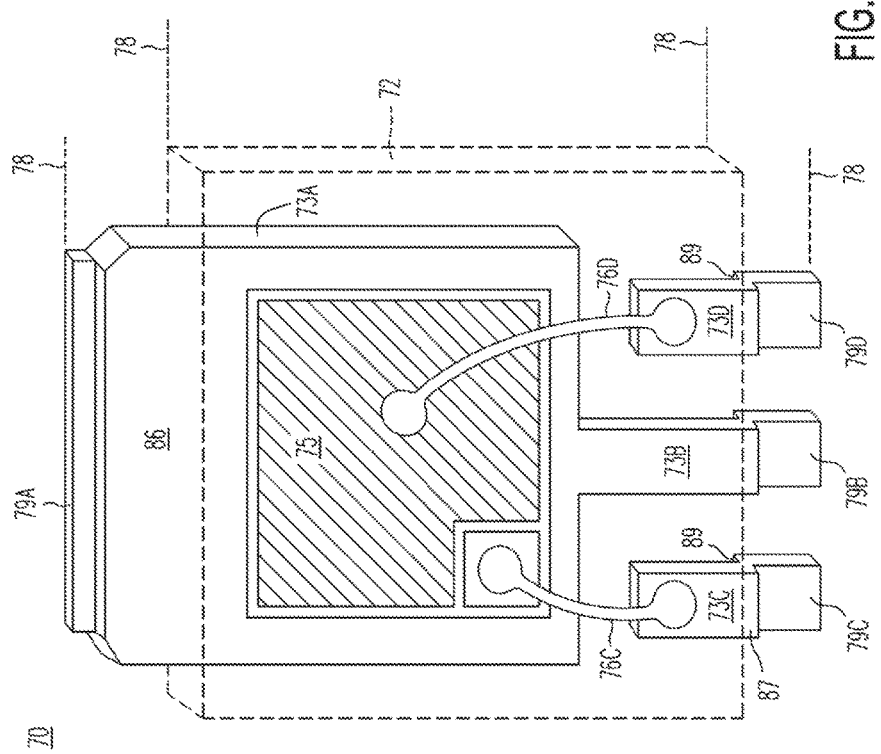
FIG. 7A is a plan view of a footed power package in accordance with the invention.

Footed Package Design Rather than relying on conductive "leads" extending from the center of a semiconductor power package and mechanically bent into an inexact position, the disclosed invention comprises a "footed" package where short conductors, or "feet" precisely coplanar with the bottom of the heat sink and die tab, extend laterally at the bottom of the package to facilitate soldering. FIG. 7A illustrates one embodiment of a footed power package 70 disclosed herein.

The footed power package 70 comprises a copper die pad 73A connected to a conductive lead 73B extending outside molded plastic 72 as a foot 79B. Two independent conductive leads 73C and 73D internal to the package 70 also extend outside molded plastic 72 with corresponding feet 79C and 79D. Similarly, but on an opposing edge of the package, a heat tab 86 extends beyond molded plastic 72, primarily to facilitate a larger area for heat spreading from the power package into PCB conductors. Unlike conventional power packages with bent leads, the bottom of feet 79C, 79B and 79D in the footed power package are precisely coplanar with the bottoms of die pad 73A and heat tab 86 along a planar surface 78 because they are constructed out of a single piece of copper without any bending or mechanical forming steps.

As illustrated in the cross-sectional view of FIG. 7B, taken through a cut line along and through conductive lead 73D, the top of internal conductive lead 73D, coincident with a planar surface is coplanar with the top of die pad 73A. As shown, a semiconductor die 75, attached to die pad 73A by a solder or conductive epoxy layer 135, has a portion of its metalized top surface connected to conductive lead 73D by a bonding wire 76D, comprising gold, aluminum, copper or other conductive metallic wires. Conductive lead 73D protrudes slightly outside of molded plastic 72 as a ledge 87 having a vertical thickness greater than that of foot 79D. Beneath ledge 87, the sidewall of conductive lead 73D is also expensed, i.e. not covered or enclosed within molded plastic 2. The purpose of foot 79D having a thickness less than that of die pad 73A is to improve solder wetting, i.e. the surface tension pulling molten solder onto to the copper foot 79D, and thereby improve the solderability of the package 70 during wave soldering in PCB assembly. The corresponding thickness of foot 79A of heat tab 86 likewise improves solderability of the heat tab 86. Similarly, the benefit of exposing ledge 87 outside of molded plastic 2 is that the exposed metal on the vertical edges, i.e. the vertical sidewalls of conductor 73D, increases the surface area available for soldering. If desired, however, in an alternative embodiment no ledge 87 is exposed and the vertical sidewalls of conductor 73D may remain encapsulated in molded plastic 2 and only the foot 79D protrudes laterally beyond molded plastic 2.

Also in the example shown, the inner end of internal conductive lead 73D, facing die pad 73A, is not exposed on the underside of the package along planar surface 78 but instead is vertically spaced above the bottom of the package by a gap 89 filled with the same plastic mold compound as molded plastic 2. The benefit of embedding the inner end of conductive lead 73D in plastic and not exposing it at the surface 78 is to reduce the risk of an electrical short between die pad 73A and lead 73D. The lateral extent 81Y of the metal comprising foot 79A may be determined either by chemical etching, stamping, or cutting during lead frame construction, or alternatively during singulation by saw, punch, or laser. The lateral extent 80Y of foot 79D, i.e. the length of foot 79D is determined during singulation by saw, punch, or laser.

FIG. 7C illustrates another cross-sectional view of the footed power package 70, taken at a cut line along and through conductive lead 73B, which extends from die pad 73A. As in the case of conductive lead 73D shown previously and conductive lead 73C (not shown), the top of internal conductive lead 73B, coincident with planar surface 78, is both coplanar with and connected to die pad 73A. Conductive lead 73B protrudes slightly outside of molded plastic 72 as ledge 87 having a vertical thickness greater than that of foot 79B. The purpose of foot 79B having a thickness less than that of die pad 73A is to improve solder wetting, i.e. the surface tension pulling molten solder onto the copper foot, and thereby improve the solderability of the package 70 during wave soldering in PCB assembly. As in the case of conductive leads 73C and 73D, the benefit of exposing ledge 87 outside of molded plastic 2 is that the exposed metal on the vertical edges, i.e. the vertical sidewalls of conductor 73B, increases the surface area available for soldering. If desired, however, in an alternative embodiment no ledge 87 is exposed and the vertical sidewalls of conductor 73B remain encapsulated in molded plastic 2 and only the foot 79B protrudes laterally beyond molded plastic 2. As described in connection with FIG. 7B, the lateral extent 81Y of the metal comprising foot 79A may be determined either by chemical etching, stamping, or cutting during lead frame construction, or alternatively during singulation by saw, punch, or laser. The lateral extent 80Y of foot 79B, i.e. the length of foot 79B is determined during singulation by saw, punch, or laser.

Also in the example shown, the internal portion of conductive lead 73D is not exposed on the underside of the package along planar surface 78 but instead is vertically spaced above the bottom of the package by a gap 89 filled with the same plastic mold compound as molded plastic 2. The benefit of embedding this conductive lead in plastic and not exposing it to the PCB surface is to reduce the risk of PCB shorts.

Figure 7D:
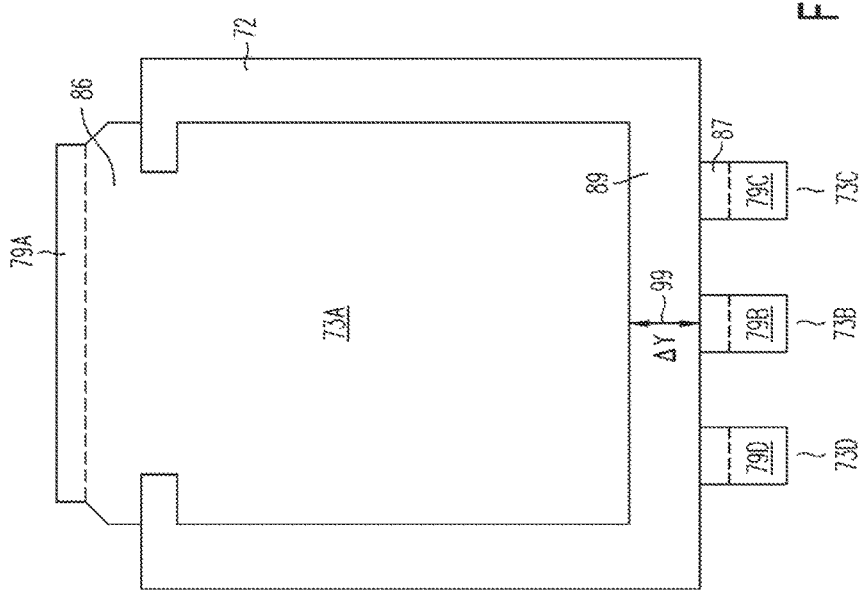
FIG. 7D is a bottom plan view of the footed power package.

The benefit of having a gap 89 between leads 73D and 73B, respectively, and die pad 73A is more clearly represented by the underside view of the disclosed footed power package, shown in the underside view FIG. 7D, where the only portions of conductive leads 73D, 73B, and 73C appearing on the package underside are the corresponding feet 79D, 79B, and 79C protruding laterally beyond molded plastic 72. As such, a lateral space defined by the width of molded plastic 72 exposed on the package backside provides a buffer distance 99 between feet 79D and 79C, respectively, and exposed die pad 73A to avoid electrical shorts from occurring beneath footed power package 70. This buffer distance 99 should ideally be as wide as the gap between the metallic feet 79C, 79B, and 79D. A cross sectional view also shown in FIG. 7D, illustrates in a cross section across the package, i.e. on a cut line through the sides of the package with no leads on it, that molded plastic 72 entirely encapsulates die pad 73A so that no metal tabs or feet protrude through the sides of the package.

Although the cross-sectional illustrations shown previously in FIG. 7B and FIG. 7C represent cut lines through die pad 73A with either independent conductive lead 73D or connected conductive lead 73B respectively, it is understood that a cross-sectional view through any other independent conductive lead or die-connected conductive lead would be similar. For example, a cross-sectional view taken through independent conductive lead 73C would appear similar to FIG. 7B, except that conductive lead 79D with foot 79D would be relabeled as conductive lead 79C with foot 79C, and correspondingly bond wire 76D would be relabeled as bond wire 76C.

In another embodiment, the top surfaces of independent conductive leads 73C and 73D are not coplanar with the top surface of die pad 73A (planar surface 88), but instead are positioned at a level above the top surface of lead frame 73A.

Referring again to FIG. 7A, semiconductor die 75 containing two separate metalized areas is mounted by conductive epoxy or solder layer 135 onto die pad 73A. One or more bonding wires 76D connect the large metalized area of semiconductor die 75 to internal conductor 73D and foot 79D. In the case of a vertical power device, this connection would typically comprise the source of a vertical power MOSFET, the anode of an IGBT, SCR, or thyristor, or the base of a vertical power bipolar transistor. The smaller metalized area of semiconductor die 75 connected by bonding wire 76C to internal conductor 73C and foot 79C. In the case of a vertical power device, this connection would typically comprise the gate of a vertical power MOSFET or IGBT, or the base of a vertical power bipolar transistor, SCR, or thyristor.

The die pad 73A and its associated internal conductor 73B and foot 79B provide electrical connection to the backside of semiconductor die 75. Similar to that shown previously in FIG. 5B, generally semiconductor die 75 requires backside metallization in order to insure good ohmic contact to the semiconductor substrate with low contact resistance. Backside metallization is, by contrast, uncommon and unneeded in integrated circuit assembly, as the substrate wafer does not carry appreciable current as it does in vertical power devices. In power applications, the purpose of die pad 73A with its conductive backside exposed to planar surface 78 is not simply to conduct current, but also to conduct heat.

To enhance the heat-spreading capability and reduce the package's thermal resistance, heat tab 86, including foot 79A, is included to increase the overall surface area. Maximizing thermal conduction from die tab 73A and heat tab 86 into the PCB on which power package 70 is mounted requires the use of solder placed manually onto the PCB prior to the mounting of power package 70 thereon. As a unique feature of the footed power package 70, foot 79A can easily be soldered during wave soldering and good electrical contact can be achieved without the need for soldering the underside of die pad 73A to the PCB. As a result, footed power package 70 can avoid the extra soldering operation required to apply the solder layer 135 between the package 70 and die pad 73A (see FIG. 7B), by employing any thermally conductive compound, including thermally conductive epoxy or thermal paste, in place of solder layer 135 to achieve a low thermal resistance, even if the compound is not electrically as conductive as solder. A low electrical resistance between semiconductor-die 75 and die pad 73A is achieved because foot 79A of heat tab 86 is wave solder compatible.

As shown, the example illustrated in FIG. 7A is designed with external connections, i.e. conductive leads, similar in placement to the DPAK or D²PAK, representing an interchangeable pin-for-pin compatible replacement of today's common surface-mount power packages, easily adaptable to existing PCB designs. Although the external placement of the solder pads remains the same, the disclosed device accommodates a larger die for the same PCB area. Alternatively, for the PCB area saved by eliminating the need for wire bending, a smaller package can be designed to accommodate the same sized semiconductor die. While improving PCB areal efficiency, the disadvantage of a custom package design requiring different spacing of PCB landing pads, is that such designs are not backward compatible with existing PCBs created for conventional DPAK and D²PAK packages.

Figure 7E:
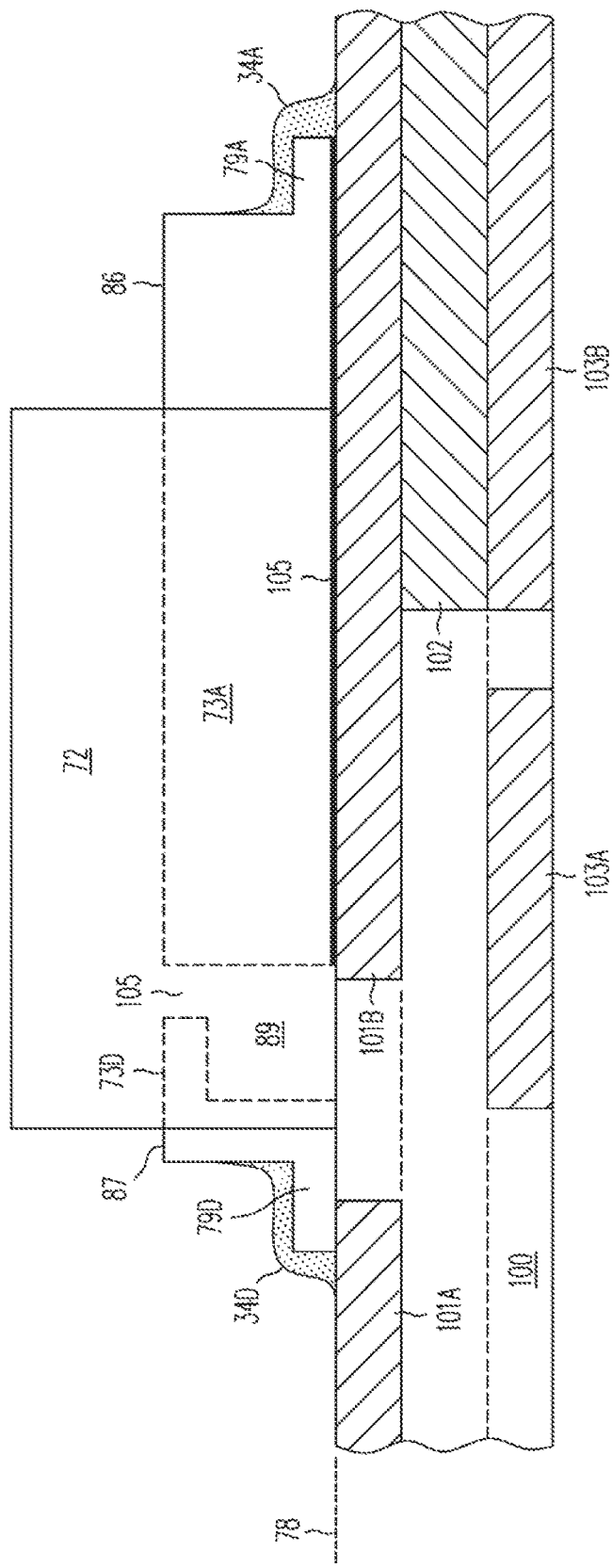
FIG. 7E is a cross-sectional view of the footed power package mounted on a PCB.

Mounting of a footed package on a PCB is illustrated on FIG. 7E, where PCB 100 comprises bottom conductive layers 103A and 103B, top conductive layers 101A and 101B, and conductive via 102. As shown, solder layer 34D electrically connects foot 79D and conductive lead 73D to PCB conductor 101A, while solder layer 34A electrically connects foot 79A or heat sink 86 and die pad 73A to PCB conductor 101B. Thermally conductive layer 105, comprising a thermally conductive compound or solder, improves thermal conduction from die pad 73A and heat tab 86 into PCB top conductor 101B, conductive via 102, and PCB bottom conductor 103B. If thermally conductive layer 105 is not electrically conductive, e.g. comprising an organic thermal compound, all current from die pad 73A must flow through the conductive path represented by solder layer 34A and foot 79A. If thermally conductive layer 105 comprises solder, electrical conduction also occurs directly from die pad 73A into PCB conductor 101B.

As shown, because of surface tension, solder layer 34A is pulled onto foot 79A to complete the electrical connection between the footed power package and the PCB 100. Similarly, solder layer 34D is pulled onto foot 79D and even onto to the exposed vertical sidewall of conductive lead 73D. In this manner, the footed power package is wave solder compatible in the same manner as a conventional footed package.

The DPAK and D²PAK compatible footed power package is illustrated in perspective view in FIG. 7F, showing the unique feature of foot 79A extending from heat tab 86. The bottom of the package including molded plastic 72, the pad 73A (not visible), heat tab 86, feet 79A and 79C and other feet (not shown) are all coplanar with planar surface 78 and do not depend on any metal bending or mechanical forming. An alternative perspective shown in FIG. 7G illustrates the coplanarity of feet 79C, 79B, and 79D and the corresponding exposed vertical side walls of leads 73C, 73B, and 73D beneath ledge 87. The feet are precisely coplanar because all the feet, namely feet 79A, 79C, 79B, and 79D, are made from the same piece of copper as die pad 73A and heat tab 86 without any metal bending or mechanical forming.

An alternative heat tab design is shown in FIG. 8A comprising heat tab 86 with foot 79A surrounding three sides of heat tab 86 instead of only on edge. Another version of heat tab eliminating all diagonal angles is shown in FIG. 8B. This simple rectilinear design is more easily fabricated using punch tools in leadframe manufacturing, where more elaborate geometries are more applicable for chemical or laser based fabrication.

Footed Package Fabrication Manufacturing of the footed package 70 disclosed herein starts with a sold sheet of copper 110, typically 400 µm thick. The thickness can be adjusted to be thicker or thinner depending on the package's purpose and application. As shown in FIG. 9A, through a combination of chemical etching, stamping, sawing, or laser cutting, the starting copper sheet will be processed into various sections as defined schematically by dotted lines in order to fabricate the features unique to the footed power package. The markers defined by vertical lines 80Y and 81Y illustrate the lateral extent of the package after fabrication and singulation, i.e. after each discrete package is separated from its neighbors on the same leadframe. All subsequent cross sections will be illustrated with respect to this starting illustration. For reference, the bottom of the copper sheet that forms the backside of the package and copper leadframe is illustrated to be coplanar with planar surface 78.

In FIG. 9B, the backside of the copper sheet 110 is masked using a patterned protective coating, i.e. mask 101, having selective openings 102A and 102B defining where the copper sheet 110 is to be etched. While the drawing is two dimensional, it is understood that openings 102 in the mask extend into the third dimension not shown in the two-dimensional illustration. Mask 101 may include any materials, including organic compounds or photoresist, that are not attacked or etched by wet chemical metal etches such as sulfuric acid, nitric acid, hydrofluoric acid (HF), ammonia and other caustic chemicals. Mask 101 may be applied uniformly and then subsequently patterned, or it may be applied in patterned form from the onset. For example, mask 101 may comprise an organic coating applied through a stencil mask or printed to define its pattern. Alternatively, mask 101 may comprise organic photoresist, coated uniformly, soft baked to prevent it from moving, and then exposed to light through an optical photomask to optically transfer the pattern to the mask. After exposure, an organic developer removes the photoresist from the locations of openings 102A and 102B but leaves mask 101 in place to protect the remaining areas. Region 89 schematically represents the copper area to be removed by the subsequent etching.

After its application and patterning, patterned mask 101 is then baked to harden the material. The term "hard baked" is sometimes used to define that the bake temperature is sufficiently high to cross link carbon bonds into a strong polymer like molecule able to survive acid etches for extended durations. In contrast to soft baking where an organic photoresist retains its photosensitivity, after hard baking, the resist is no longer photosensitive. While the bake temperature varies on the selection of the mask chemistry, a soft bake may for example occur at 100° C. for around 1 to 4 minutes while a hard bake may occur at a higher temperature, e.g. 130° C. to 140° C. After hard baking the mask layer, the copper is then etched in an acid, e.g. using hydrochloric acid comprising $HCL:FeCl_3:H_2O$ in a 4:1:5 mixture, nitric acid comprising $HNO_3:H_2O_2$ in a 1:20 mixture, or ammonia comprising NH3:H2O2 in a mixture of 4:1.

If the copper is pre-plated with a thin layer of tin (Sn) for improved solderability in PCB manufacturing, then the tin must first be removed by etching using, for example, hydrofluoric acid comprising HF:HCL in a 1:1 mixture, $HF:HNO_3$ in a 1:1 mixture, or $HF:H_2O$ in a 1:1 mixture. A more thorough list of common wet chemical metal etches can be found in semiconductor process textbooks or online at http://www.cleanroom.byu.edu/wet_etch.phtml. The tin and copper may be etched on one side or by immersion in an acid bath. In the case of immersion etching, to prevent unwanted etching and thinning of the leadframe the metal leadframe's backside must be coated by another protective layer. For clarity's sake, this backside protection is not shown in the illustrations but is well known by those skilled in the art of semiconductor packaging.

In an alternative fabrication method, wet chemical etching may be replaced by plasma or reactive ion etching, also known as "dry etching", using a non-corrosive gas such as HBr or Cl$_2$/Ar that decomposes into reactive components in the presence of a radio frequency modulated electric field. The RF-excited gas ions in the plasma then chemically etch the metallic copper ions, removing them as gas. Once the plasma is extinguished, the gas returns to a non-corrosive form. In most cases, dry etching occurs on only once side of the copper and therefore no protective layer is need to cover the opposite side of the copper sheet.

As illustrated, the etch of copper sheet 110 is designed to produce an etched region 89 that does not completely penetrate the copper sheet 110 but retains some portion of the copper un-etched, e.g. with 50% to 90% of the thickness of copper sheet 110 remaining. For example a 400 μm thick copper sheet 110 might be etched to remove 300 μm, leaving a locally thin portion of copper 100 μm thick. The region 89 is etched not only through opening 102A in the vicinity of the conductive leads but also in the "street" beyond vertical line 81Y through opening 102B. After etching, mask 101 is removed chemically or in a special etcher known as an "asher", a plasma etcher designed to remove organic compounds. The resulting patterned copper sheet 110 is shown in the cross-sectional view of FIG. 9C. At this point in the fabrication, i.e. after backside etching, the etched copper sheet 110 may now be visually identified as a partially fabricated leadframe for semiconductor packaging. (Accordingly, copper sheet 110 will henceforth sometimes be referred to as "leadframe 110.") The leadframe 110 typically comprises many identical units temporarily held together by copper "rails" and "tie bars", pieces of copper to hold the actual leadframe copper pieces in place until the molded plastic later binds them.

The next step is to mask the copper leadframe 110 with a mask 103 on the opposite side of the leadframe 110 from the side etched in the previous operation, i.e. on its front side. After patterning, mask 103 includes openings 104A, 104B and 104C. As shown, opening 104A, used to define an area 105A to be etched, sits atop etched region 89, thinned by the previous etching step, while opening 104B is used to create etched region 91A in previously un-etched portions of the leadframe 110 where between 30% to 80% of the leadframe is removed, retaining a thin piece of copper comprising foot 79D after the etching. In opening 104A, located atop etched region 89, the region to be etched, i.e. region 105A merges with the previously etched region 89 to completely remove all the copper from the leadframe 110. Etching is then performed using dry etching or wet chemical etching, generally in a manner similar to the prior etching step. After etching mask 103 is removed.

So while the specific etch times for the backside etch and front side etch are flexible, one process criterion to insure proper package fabrication is that the thickness of leadframe 110 removed by a combination of the backside etch and the top side etch may exceed the entire starting thickness of copper sheet 110. For example, if the backside etch (FIG. 9B) removes 60% of the thickness of copper leadframe 110, the front side etch (FIG. 9C) removes greater than 40% of the thickness of copper leadframe 110. If the backside etch removes 50% of the thickness of copper leadframe 110, then the front side etch removes greater than 50% of the thickness of copper leadframe 110. Since one goal of the package design is to achieve easy solderability of the package feet, then in a preferred embodiment the feet should not be too thick, i.e. it is beneficial for the front side etch to be substantially greater than the backside etch.

For example, if a 100 μm thick foot requires a 75% front side etch of a 400 μm copper sheet 110, then the backside etch needs to remove at least 25% of the copper thickness. If. a 150 μm thick foot is desired, then 71% of the thickness of copper sheet 110 should be removed by the front side etch, and at least 29% of the copper should be removed by the backside etch. As a matter of good manufacturing practice, an over etch of at least 10% should be performed to guarantee the metal clears in areas where the copper is to be completely removed, e.g. under photoresist opening 104A. Accordingly, a 100 μm thick foot with a 75% front side etch should be preceded by a 35% backside etch, and similarly a 150 μm foot with a 71% front side etch should be preceded by a 39% backside etch.

Opening 104C comprises two regions—inside of vertical line 81Y and outside of 81Y in the package "street". Within vertical line 81Y, leadframe 91B is removed retaining foot 79A. Outside of vertical line 81Y, the removed copper portion 105B merges with the previously etched portion 89 completely removing copper from the package street outside of vertical line 81Y. In this manner, as summarized in the following table, four possible regions can be formed using this two etch process sequence:

| Resulting Structure | Backside | Front Side | Underside | Package Element |
|---|---|---|---|---|
| Un-Etched Leadframe | Protected | Protected | Exposed | Die Pad, Ledge |
| Elevated Beam | Etched | Protected | Encased | Internal Lead |
| Foot | Protected | Etched | Exposed | Foot (Ext. Lead) |
| Leadframe Removed | Etched | Etched | Encased | Street, Gap |

As described, the backside-etch and front side etch in various combinations produce all necessary structures in footed power package fabrication. Any un-etched region results in the full thickness of leadframe 110 forms the die pad 73A, heat tab 86, ledge 87 and vertical conductor connection to a corresponding foot, e.g. the vertical portion of conductive lead 73D connecting to foot 79D. The underside of such regions is electrically exposed to the PCB.

A backside-only-etch results in a ledge with a suspended conductive lead, i.e. an elevated beam, such as 73B underfilled by plastic molding in the cavity formed by etched region 89. Such elevated beam regions have no underside-exposed conductors. A front-side-only etch results in a foot used for soldering and with a conductive surface exposed to the PCB. The combination of both backside and front side etches completely clears all the copper with no underside-exposed conductors. This combination is useful in the package street and in the gap between conductive leads and between independent leads and die pad 73A, e.g. the gap between conductive lead 73D and die pad 73D or between conductive leads 73B and 73D.

After the front side etch, the resulting leadframe is illustrated in FIG. 9D where the un-etched portion of the leadframe can now be identified as die pad 73A and heat tab 86, the thinned metal beneath etched region 91B on the right hand edge of the drawing can be recognized as foot 79A, the thinned metal beneath etched region 91A on the left hand edge of the drawing can be recognized as foot 79D, which merges with conductive lead 73D to form a mirrored "Z shape" characteristic of the footed package leads. As shown, topside etched region 105A merges with backside-etched region 89, completely severing any connection between independent conductive lead 73D and die pad 73A. Similarly, in the package street beyond vertical line 81Y, all metal is removed by the combination of a front side etch and a backside etch. At this point in the fabrication, independent conductive lead 73D is held in place by its connection to the leadframe rail located beyond vertical line 80Y (not visible in this two-dimensional cross-sectional view).

It should also be mentioned that in FIG. 9C should opening 104A be excluded from mask 103 features, then the resulting footed conductive lead would not be disconnected from die pad 73A as it is shown in FIG. 9D, but retain the same shape as in the former drawing unaltered by the subsequent etching step. The resulting lead therefore remains connected to the die pad, having a construction comprising connected conductive lead 73B shown in FIG. 7C.

In FIG. 9E, semiconductor die 75 is attached by a thermally conductive compound or solder 135 to die pad 73A, and subsequently wire bonded where bonding wire 76D connects a portion of the metalized surface of semiconductor die 75 to independent conductive lead 73D and foot 79D. In another cross section (not shown), bonding wire 76C connects a portion of the metalized surface of semiconductor die 75 to independent conductive lead 73C and foot 79C.

Lastly, in FIG. 9F, plastic molding is performed, generally using transfer molding methods well known to those of skill in the semiconductor packaging field, creating molded plastic 72, which encapsulate semiconductor die 75, bonding wire 76D and others, and fills etched regions 89 and 105A. Once the plastic hardens, the feet 79B, 79C and 79D can be cut from the leadframe rails (not shown), using a punch, saw, or laser cut made along vertical lines 80Y, resulting in a finished footed power package singulated from the leadframe and ready for electrical testing.

Figure 9G:
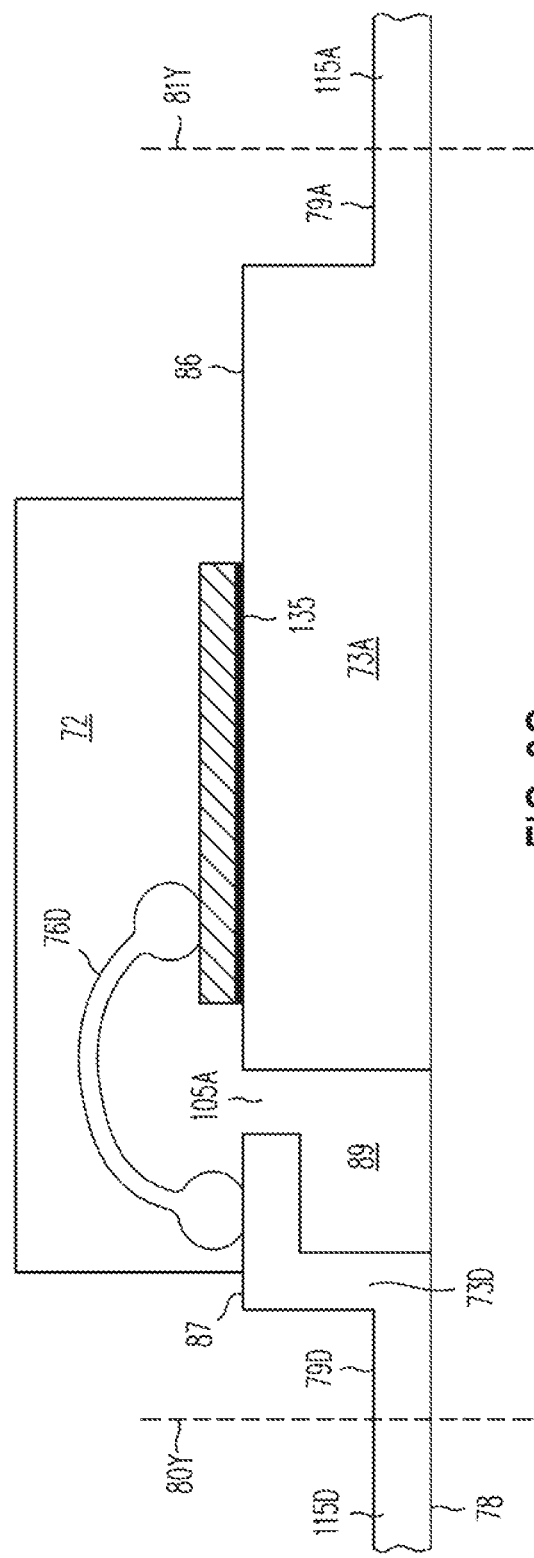
FIG. 9G is a cross-sectional view of an alternative version of a leadframe for a footed power package after molding.

In an alternative embodiment shown in FIG. 9G, foot 79A, like conductive leads with feet 78C, 79B, and 79D, is also attached to the leadframe rails through metal 115A because no backside etch was performed beyond vertical line 81Y. By leaving foot 79A connected to a leadframe rail, additional stability during wire bonding is realized. Otherwise, backside mechanical support is necessary during the wire bonding operation to prevent "diving board" like oscillation effects.

Figure 9H:
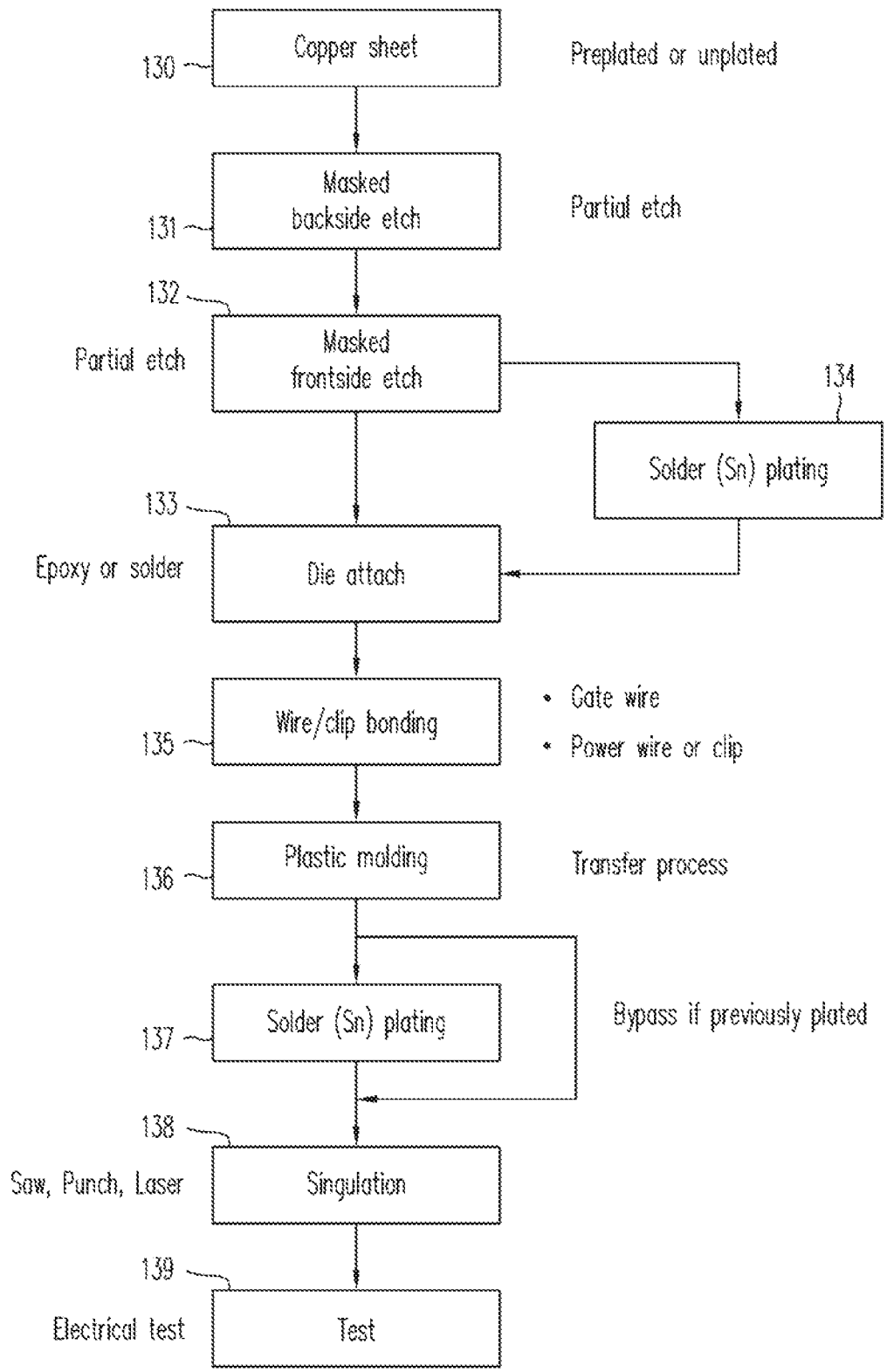
FIG. 9H is a process flow chart for the fabrication of a footed power package in accordance with the invention.

FIG. 9H illustrates the fabrication sequence for the footed power package starting with a copper sheet in step 130. The copper sheet may be pre-plated with a solderable metal such as tin (Sn) or comprise pure copper. In step 131 the backside of the copper sheet is masked and partially etched to a final thickness nominally less than 50%, e.g. 29%. In step 132 the front side of the copper sheet is masked and partially etched to a final thickness nominally greater than 50%, e.g. 61%. Thereafter the completed leadframe is plated with a solderable metal such as tin in step 133. If the leadframe is pre-plated, this step may be bypassed. In step 134, die attach is performed using epoxy or solder, followed by wire bonding in step 135, comprising wire bonding of the gate input and either wire bonding or copper clip bonding to the high current connection to the die. Next, in step 136 plastic molding using transfer molding is performed, optionally followed by tin-plating its step 137. In step 138, the individually assembled dice are singulated, i.e. separated from the leadframe, using saw, punch, or laser techniques followed by electrical test in step 139.

Leadframe Design The footed power package accommodates a flexible array of leadframe designs. FIG. 10A illustrates a plan view of a portion of a leadframe including exposed die pad 73A, heat tab 86, and foot 79A, conductive leads 73C, 73B and 73D as elevated beams atop etched region 89, vertically connecting under ledge 87 to feet 79C, 79B and 79D as defined by etch region starting at line 91B and extending onto copper rail 120B. Tie bars 115C, 115B, and 115D connect feet 79C, 79B and 79D to copper rail 120B and are cut during singulation along cut line 80Y. Similarly, foot 79A as defined by etch region starting at line 91A and extending onto copper rail 120A connects via tie bar 115A to copper rail 120A and is cut during singulation along line 81Y. The plastic mold 72 may be constructed as a single strip and cut by saw blades along the lines 80X or may be constrained to the prescribed area by the mold cavity. Cell 90 repeats multiple times in the same lead frame.

Figure 10B:
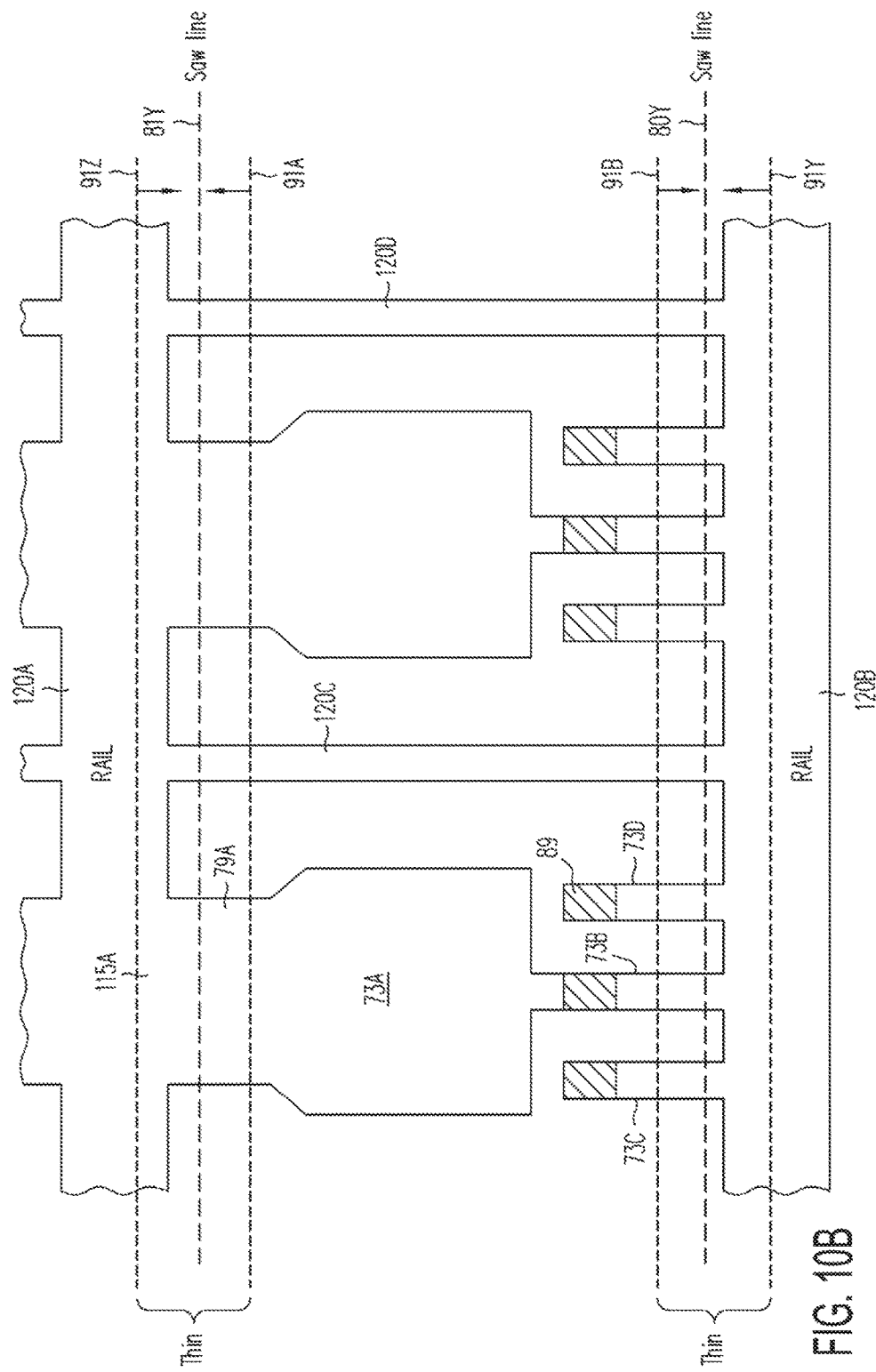
FIG. 10B is a plan view of a leadframe for a multi-die footed power package having two leadframe rails.

FIG. 10B illustrates a leadframe showing two die pads 73A connected by foot 79A and tie bar 115A to rail 120A and by conductive leads 73C, 73B, 73D to rail 120B. By suspending the die pad between two opposing rails, die pad 73A is held securely, eliminating diving board like oscillations during wise bonding. Cross rails 120C and 120D are added to provide extra mechanical support.

To improve singulation and reduce saw wear saw line 81Y is cut through thinned copper, i.e. the same thickness as foot 79A as defined by mask features 91A and 91Z. Similarly saw line 80Y is cut through thinned copper defined by mask edges 91B and 91Y. The vertical cut lines 80X shown in FIG. 10A are equally applicable to other lead frame designs and are excluded from the drawings for the sake of illustration clarity.

Figure 10C:
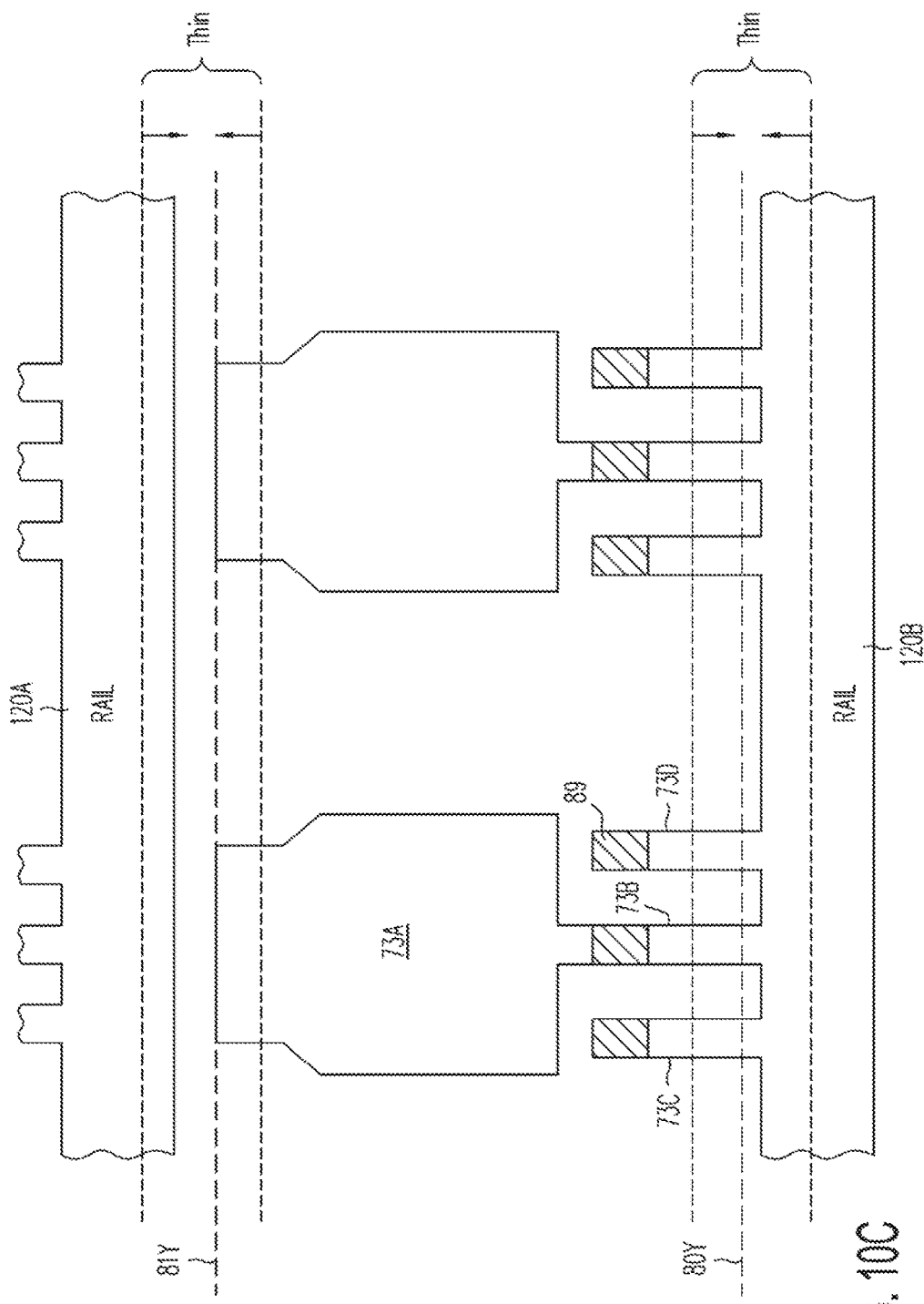
FIG. 10C is a plan view of a leadframe for a multi-die footed power package having one leadframe rail.
Figure 10D:
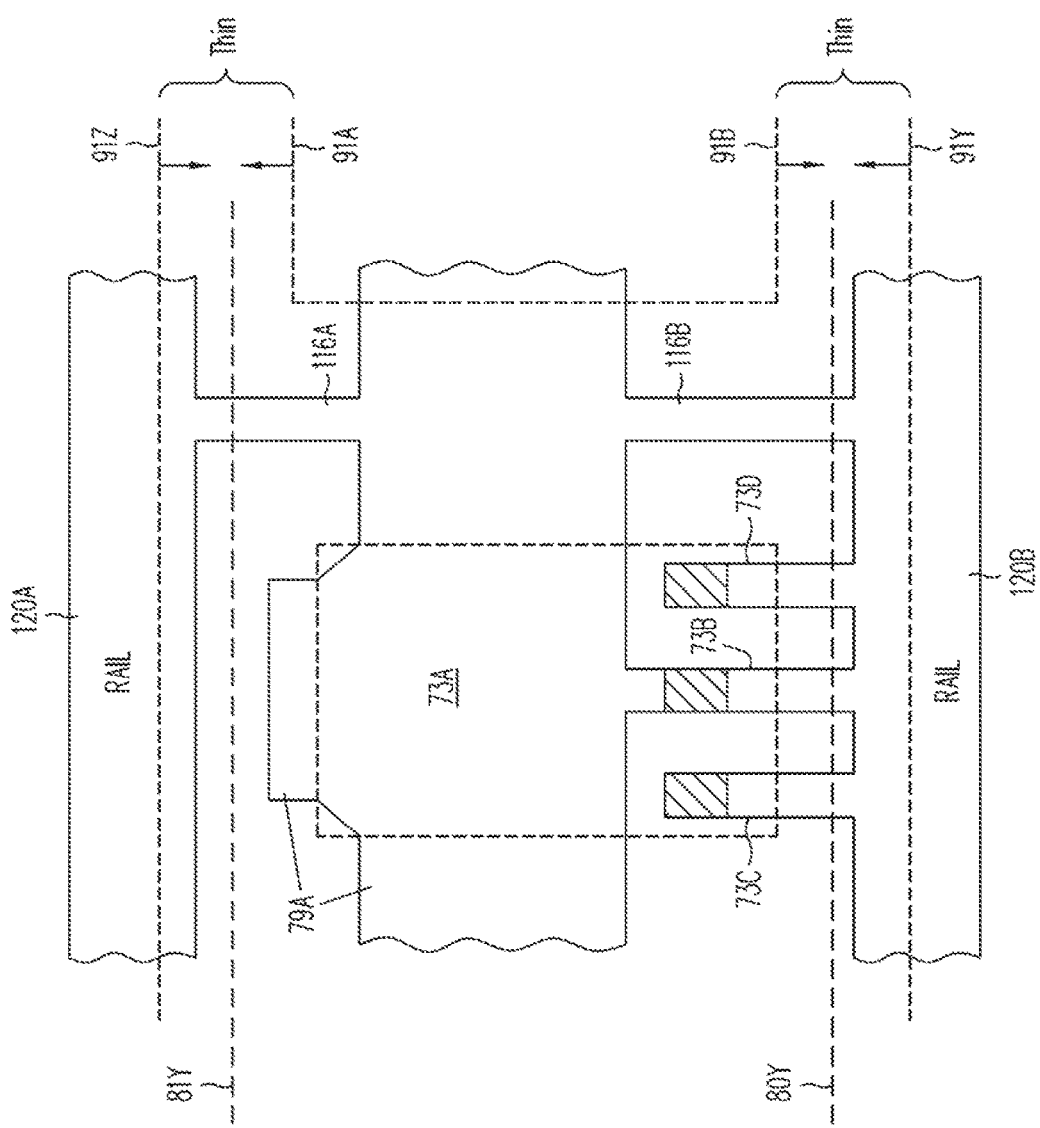
FIG. 10D is a plan view of a leadframe for a multi-die footed power package having two leadframe rails.
Figure 10E:
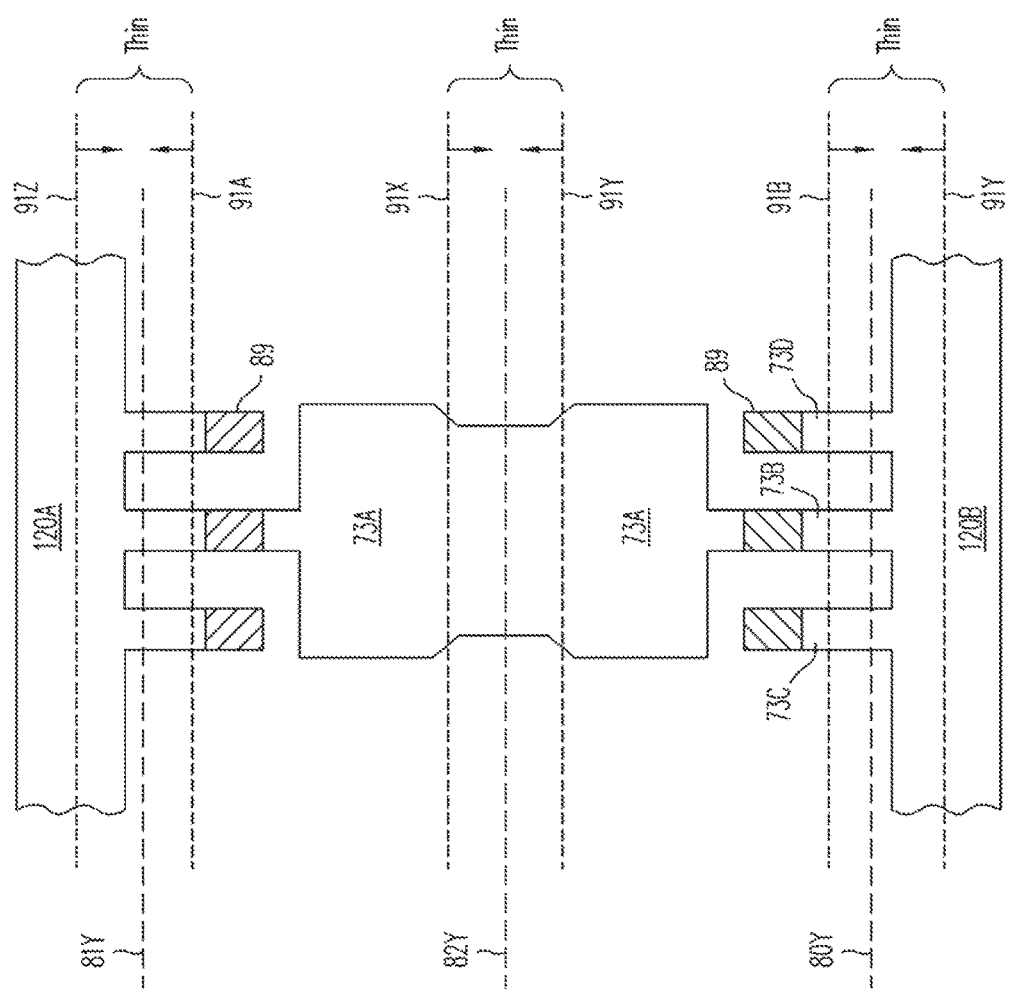
FIG. 10E is a plan view of an alternative version of a leadframe for a multi-die footed power package having two leadframe rails.

In the leadframe design shown in FIG. 10C, the lateral extent of die pad 73A along line 80Y is determined by etching during leadframe etching and not during singulation. But lacking support on both edges of the die pad, backside support is required during wire bonding. In another embodiment, shown in FIG. 10D, die pad 73A includes heat tabs on three sides, where the side heat tabs 73A extend to the tie bars 116A and 116B connected to rails 120A and 120B. In another leadframe design shown in FIG. 10E, the die pads provide mechanical support for one another, separated during singulation alone saw line 82Y.

Figure 10F:
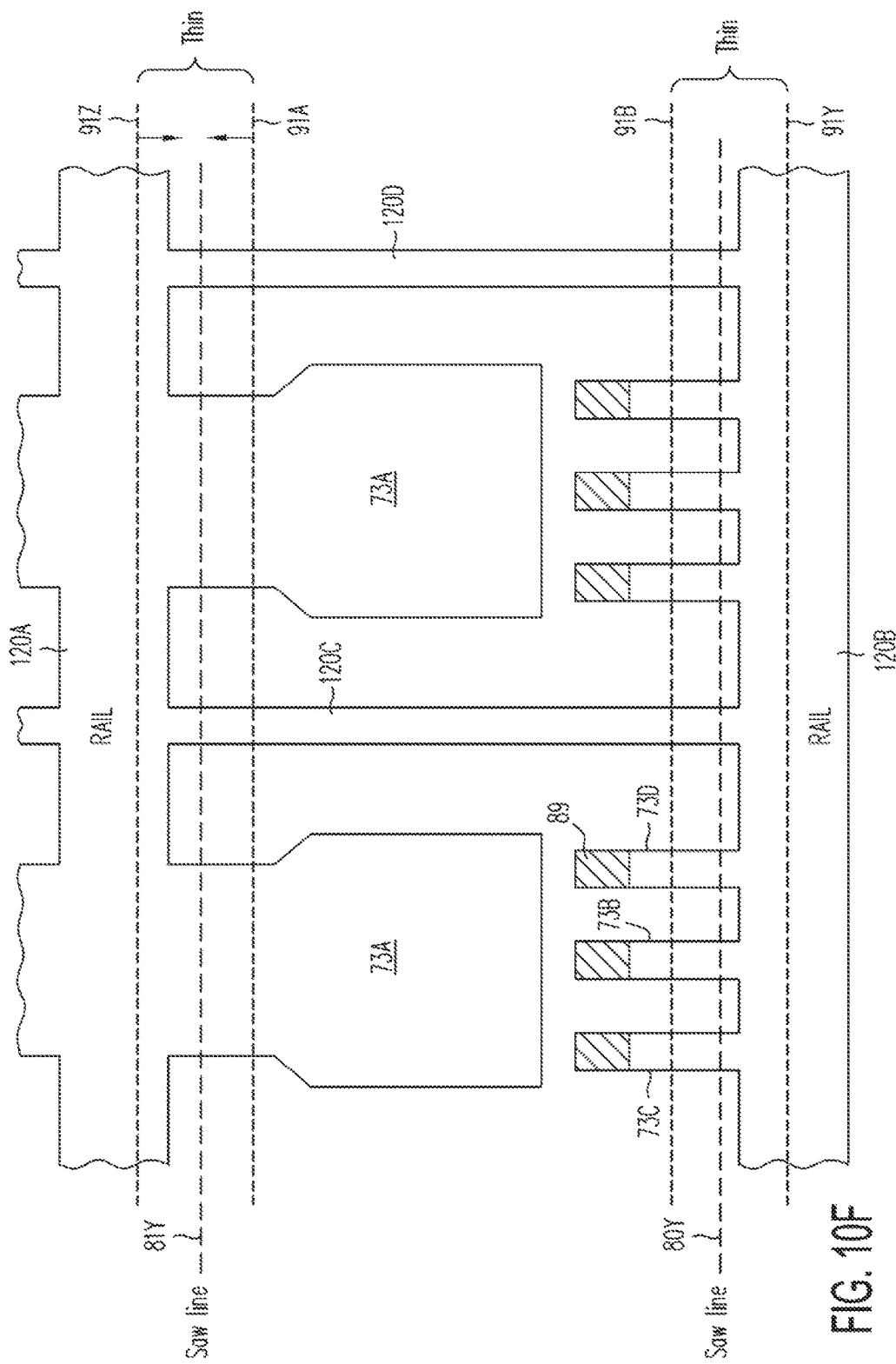
FIG. 10F is a plan view of a version of a leadframe for a multi-die footed power package leadframe having two leadframe rails with no die pad-connected leads.

In the leadframe design shown in FIG. 10F, die pad 73A is supported by rail 120A while conductive leads 73C, 73B and 73D are supported by rail 120B. Unlike the embodiments shown previously, however, in this embodiment center lead 73B is not connected electrically to die pad 73A, thereby enabling four distinct electrical connections to a three-footed package, three separate connections via each of leads 73C, 73B and 73D and one connection via die pad 73A, respectively. Cross rails 120C and 120D are added to provide extra mechanical support.

Figure 11:
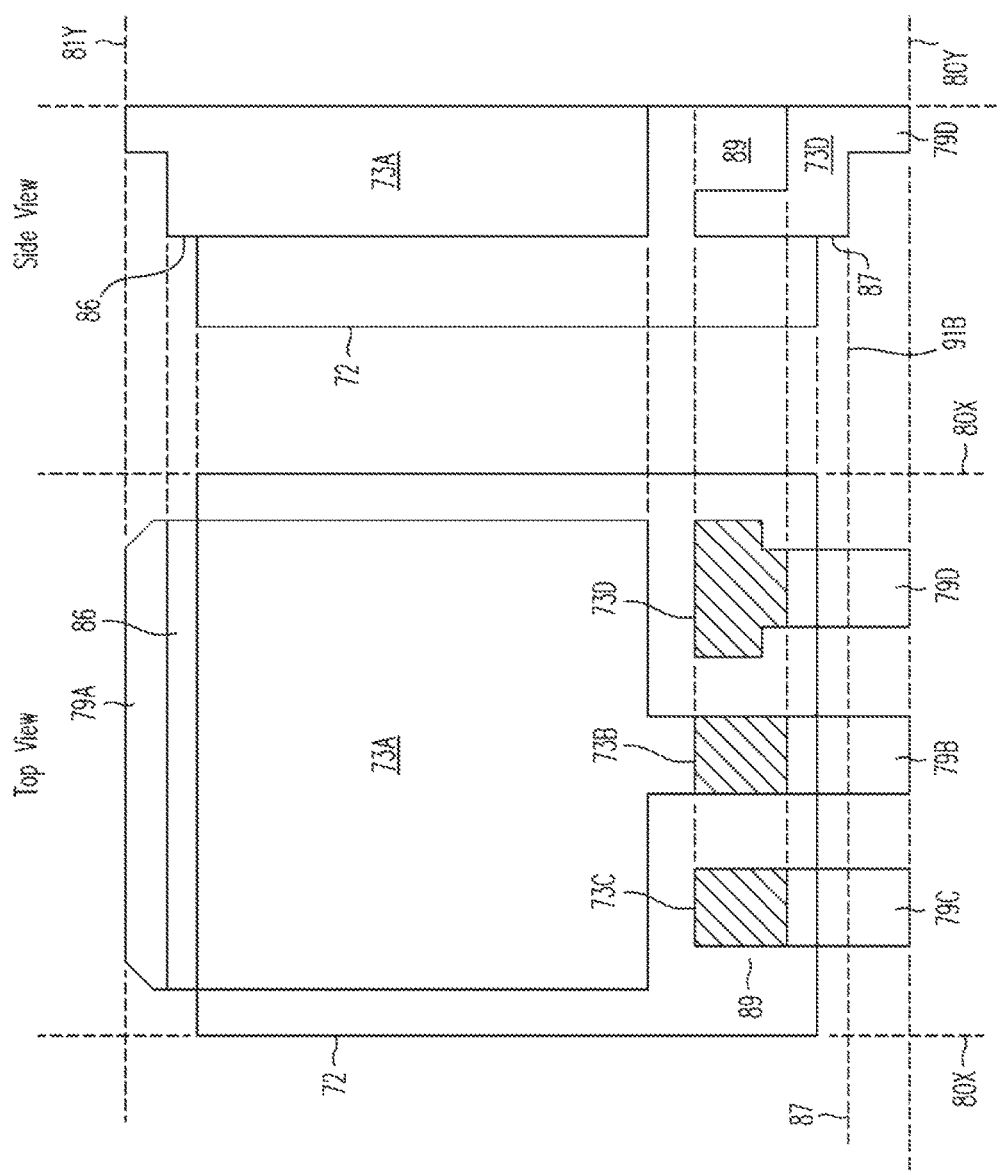
FIG. 11 is a plan view and crass-sectional view of a lead frame for a footed power package.

FIG. 11 illustrates a simplified top view and cross sectional representation of a lead frame design for the footed power package in both top view and side view by eliminating the leadframe rails and by representing the molded plastic 72 as defined by the mold cavity during manufacture rather than by sawing. As shown, the metal defined by die pad 73A, heat tab 86, foot 79A and portions of conductive leads 73C, 73B and 73D are exposed to the package's underside except for the cross hatched portion representing the conductors sitting atop plastic filled etched region 89. As shown a portion of conductive lead 73D is wider than its foot 79D. This wider T-shaped portion is included to facilitate additional bond wires for the higher current connections to the power device.

Figure 12A:
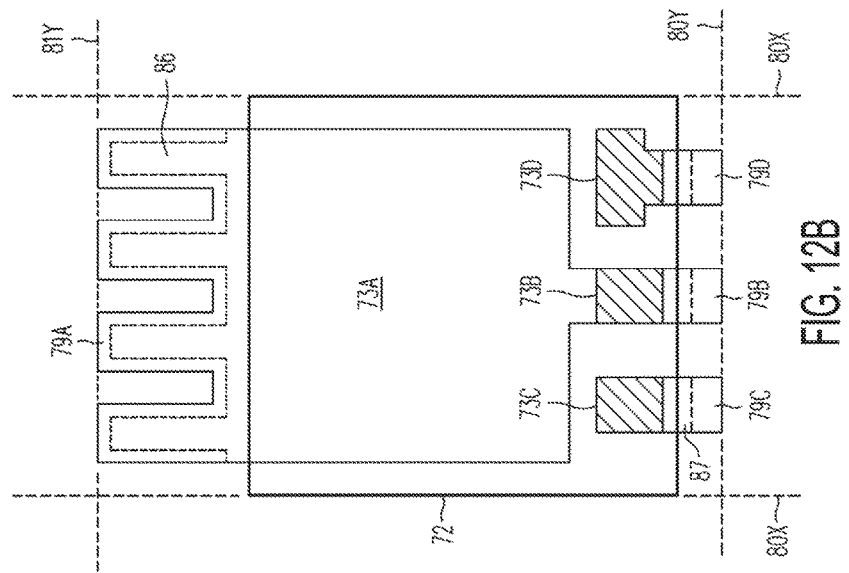
FIG. 12A is plan view of a leadframe for a footed power package with an alternative form of heat tab.
Figure 12B:
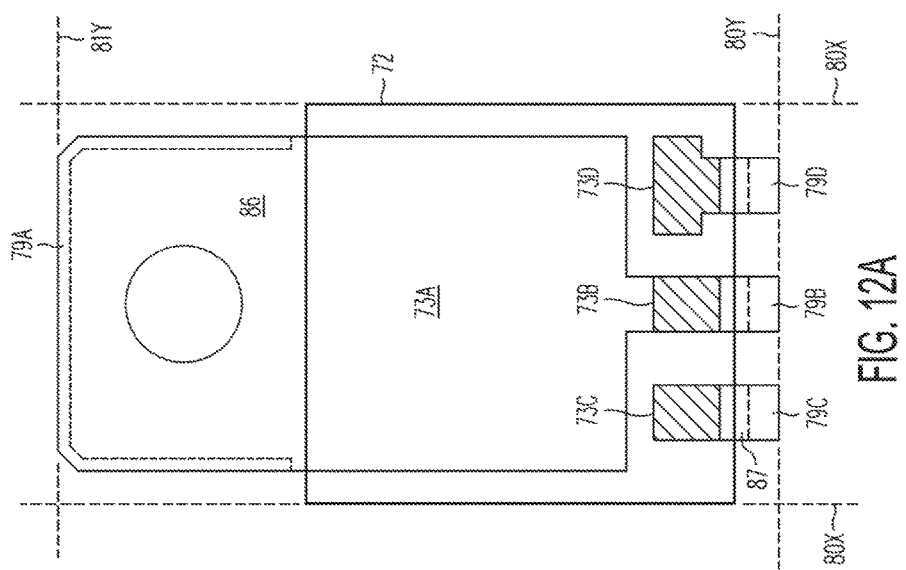
FIG. 12B is plan view of a leadframe for a footed power package with another alternative form of heat tab.

FIG. 12A represents a variant of the package where heat tab 86 is surrounded on three sides by foot 79A and includes a hole for a bolt mounting. FIG. 12B illustrates an alternative heat tab 86 design where the peripheral edge is increased relative to the area consumed by the heat tab by forming the heat tab 86 as a series of parallel fingers, facilitating a longer edge for foot 79A to improve thermal resistance for wave soldering.

FIG. 13A illustrates another variant of the foot power package with heat tab 86 and foot 79A surrounding three sides of the package. FIG. 13B illustrates another footed package variant wherein heat tab 86 and foot 79A are present on only the sides of the package.

FIG. 14A illustrates the footed package design and technology can also accommodate a package comprising a single die pad 73A with its heat tab 86 and foot 79A on two opposite sides and with feet 79B through 79G on the other two edges, thereby creating a six-footed package with five distinct electrical connections. In this version conductive leads 73B and 73E both attach to die pad 73A, providing added rigidity and mechanical support during assembly. In a variant of this package, shown in FIG. 14B, conductive lead 73E is disconnected from die pad 73A, making the power package into a six-pin package with six different electrical connections. FIG. 14C represents the same package except that the exposed backside of die pad 73A is eliminated and the die is instead mounted on the non-exposed portion of modified isolated conductive die pad 73A, with plastic filled etched cavity 86 located below the die pad. Two of the sides, however, do include heat tabs 86 and feet 79A to achieve reasonable power dissipation capability. In yet another variant shown in FIG. 14D, independent conductive leads 73C and 73D are shorted together increasing the available space for wire bonding, and in a similar manner independent conductive leads 73F and 73G are also shorted together.

Figure 15A:
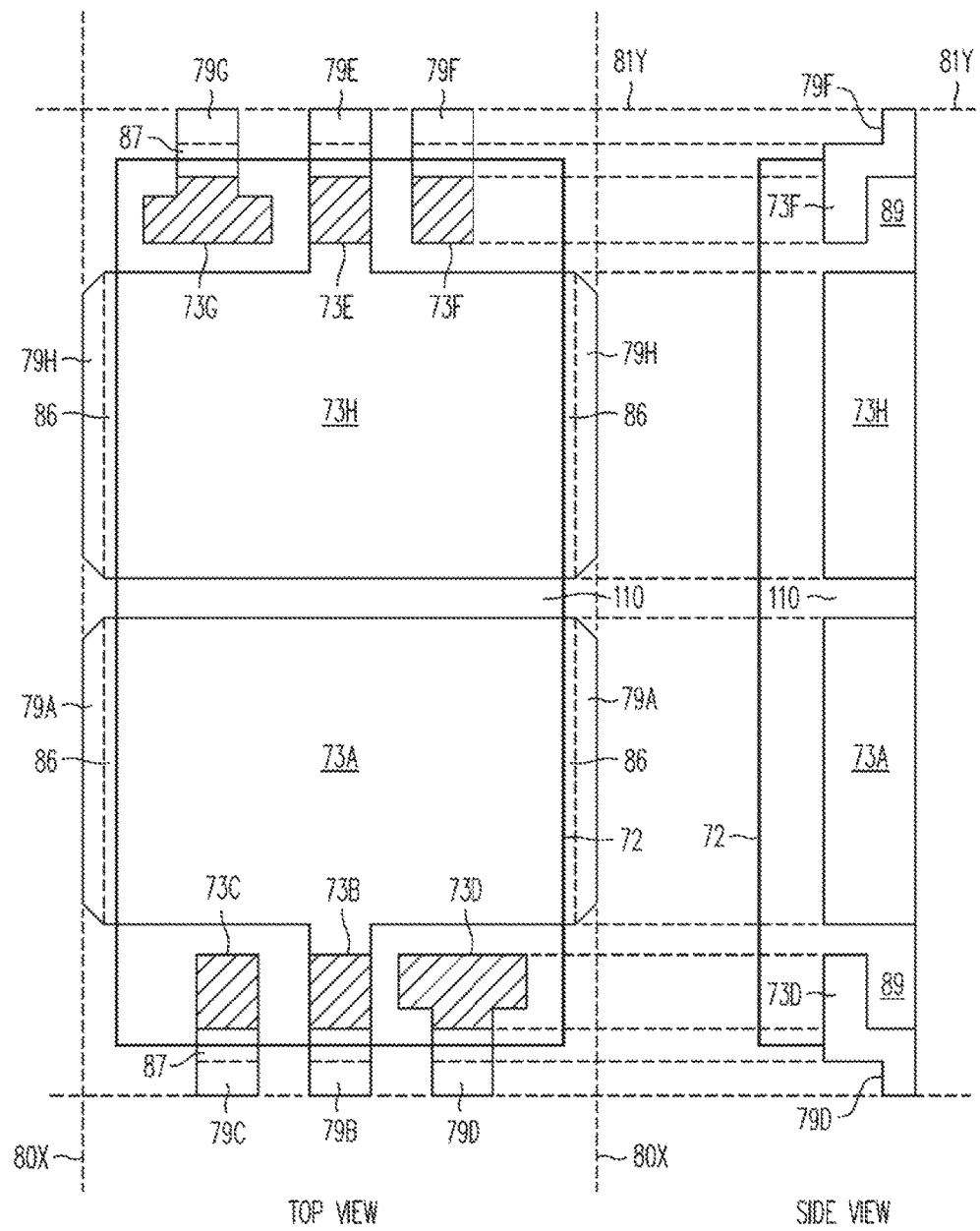
FIG. 15A is a plan and cross-sectional view of a leadframe for a footed power package with side heat tabs and dual die pads.

FIG. 15A illustrates how the multi-lead footed power package can be adapted to support two separate die pads 73A and 73H. Independent conductive leads 73C and 73D provide a means for bonding a three-terminal device mounted on die pad 73A while die-pad connected conductive lead 73B provides additional mechanical support for die pad 73A during assembly. Similarly, for the second die pad 73H independent conductive leads 73G and 73F provide a means for bonding a three-terminal device mounted on die pad 73H while die-pad connected conductive lead 73E provides additional mechanical support for die pad 73H during assembly. Since, however, both die pad 73A and die pad 73H are exposed on the underside of the package, some risk exists that the spacing from one die pad to the other may be too small and result in a PCB short.

Figure 15B:
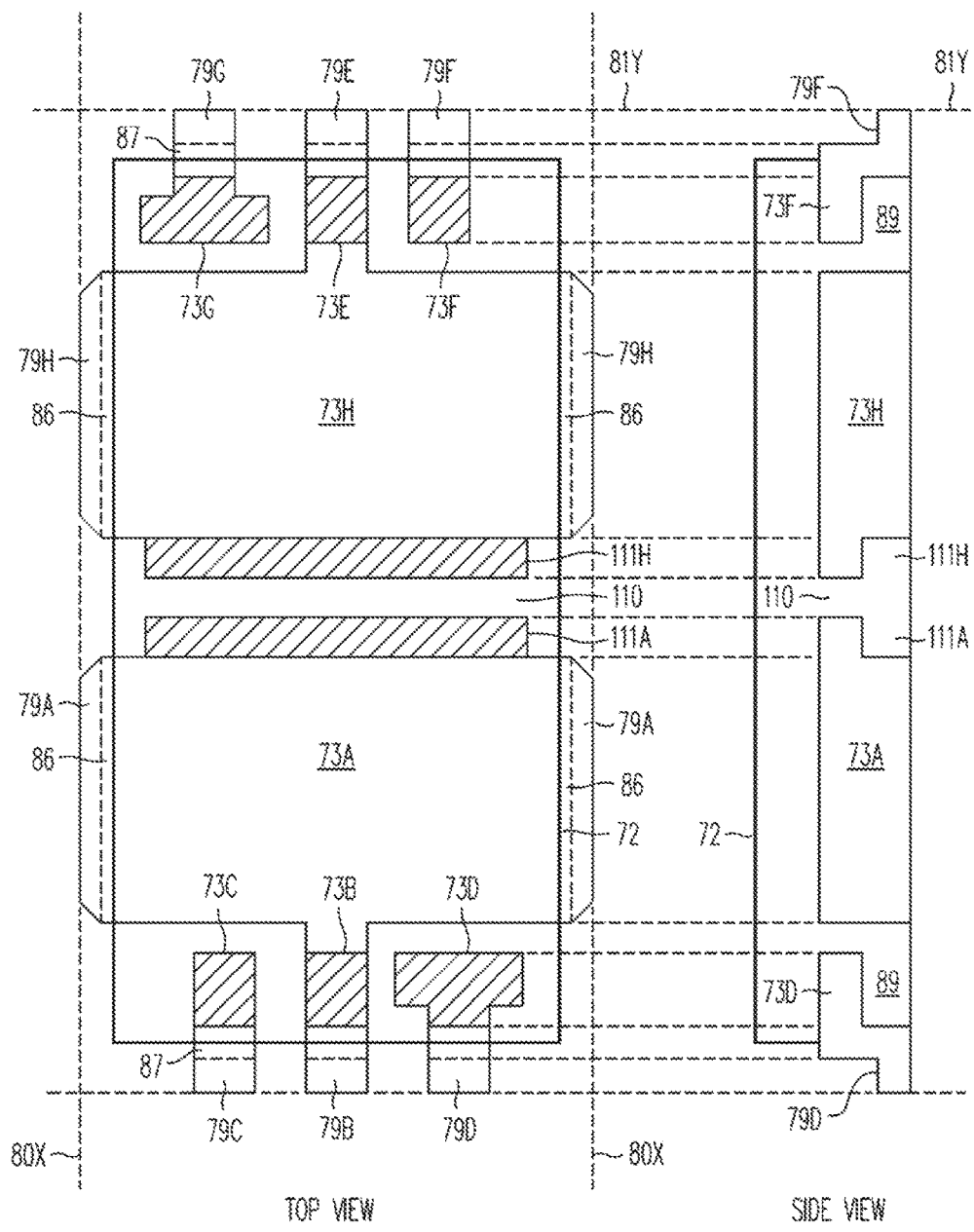
FIG. 15B is a plan and cross-sectional view of a leadframe for a footed power package with side heat tabs and dual oversized die pads.

A method to increase the space of one exposed die pad to another without reducing the maximum size of the die on either die pad can be accomplished using the design shown in FIG. 15B, wherein a portion of die pad 73A steps up onto pad extensions 111A and 111H. In this manner the same die size in the dual die pad footed package of the prior illustration is achieved but the exposed pad spacing can be increased as needed to support any PCB design rule. In all of the packages as described, any unused side of the package can be modified to include a heat tab and a corresponding foot for improved thermal conduction into the PCB.

FIG. 15A illustrates that the footed power package can be extended to support five electrical connections on one side of the package and if desired could be made pin-for-pin layout compatible with a 5-lead DPAK. Similarly, FIG. 16B illustrates that the footed power package can be extended to support seven electrical connections on one side of the package and if desired could be made pin-for-pin layout compatible with a 7-lead DPAK.

Figure 17:
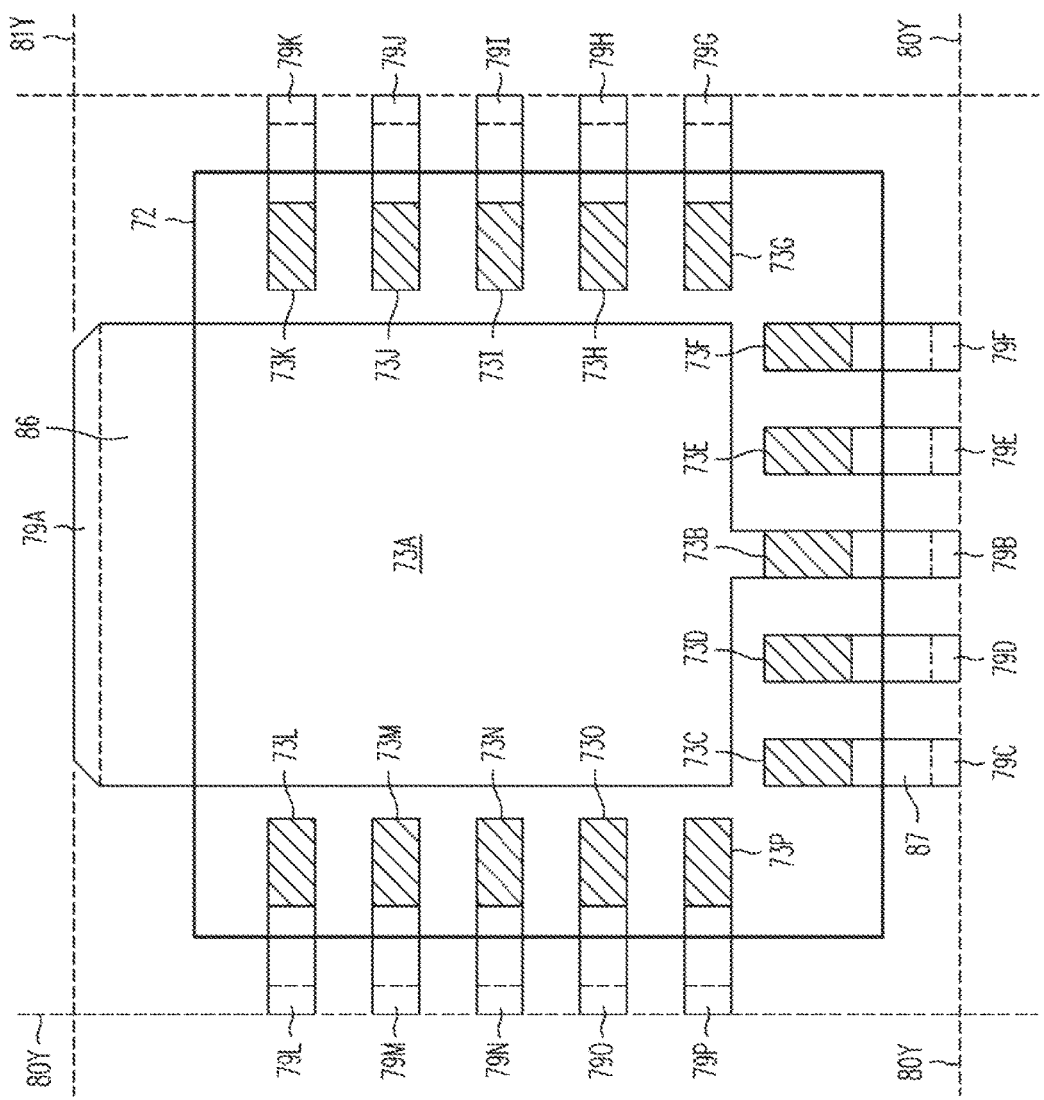
FIG. 17 is a plan view of a leadframe for a 15-lead footed power package with heat tab.

FIG. 17 illustrates the footed power package can be adapted for power integrated circuits or power systems where a single die pad 73A with heat tab 86 and foot 79A can support a multi-pin power integrated circuit. In the design shown, a fifteen-lead power package is demonstrated comprising independent conductive leads 73C through 73P with corresponding feet 79C through 79P as well as die pad connected conductive lead 73B and associated foot 79B.

FIG. 18 illustrates the use of a clip lead in a footed power package in both top and side views. As shown, using a layer 135 of conductive epoxy or solder, semiconductor die 75 is mounted onto exposed die pad 73A. Copper clip lead 90 is then mounted onto the top of semiconductor die 75 using a layer 91B of solder or conductive epoxy and using a layer 91A of solder or conductive epoxy to attach copper clip lead 90 to conductive lead 73D. For power devices having three or more electrical connections, copper clip lead 90 does not cover the entirety of semiconductor die 75 to accommodate bond wire connections to the low-current gate drive and signal connections. For example, as shown, copper clip lead 90 does not cover the gate pad connection of semiconductor die 75 to allow bond wire 76C to connect the gate pad to conductive lead 73C. The side view shown does not illustrate the presence of bond wire 76C because it is taken at a cross sectional cut line along the length of the package through foot 79D and through conductive lead 73D.

Comparison to Conventional Packages A comparison of a footed package of this invention with a conventional surface-mount power package such as a DPAK to the footed power package is shown in FIG. 19, wherein the lateral distance between $y_0$ to $y_1$ is chosen to be identical for both packages. As illustrated, the lateral dimension $y_1$ to $y_5$ is substantially greater in conventional packages because of poor manufacturing tolerances, the need to clamp the leads with lead extension 17 during bending, along the space wasted by lead bend 4D. The result is a substantial improvement in areal efficiency, especially in smaller packages where the extra fixed overhead in space is more pronounced.

A similar improvement is manifest in the vertical height $(x'_2 \ldots x'_0)$ of the footed package compared to conventional power packages. Because no lead bending is involved, the package height of the footed package is limited by the thickness of the leadframe desired and the height of molded plastic 2 needed to encapsulate the bond wires. One solution to this problem, particularly useful when the bond wires must be large in order to carry high currents, is to employ a copper clip 90 to replace the bond wires. Copper clip 90 attaches to the metalized surface of semiconductor die 75 and also to the conductive lead 73D using solder or conductive epoxy 91B and 91A as shown. Because there is no need for a large loop height to accommodate large-diameter wires, the thickness of molded plastic 72 can be greatly reduced, input signals like gate bias can be connected using a small-diameter wire bond 76C without impacting the low profile package height.

Furthermore, since the thickness of the feet is determined by etching and the bottoms of the feet and the package are precisely coplanar, there is no need to increase the package height to compensate for the inaccuracies of mechanical processes such as lead bending. As a result, the footed power package can be manufactured at package heights competitive with the QFN and thinner than gull wing IC packages.

Summary In conclusion, the footed power package as disclosed herein guarantees that the bottoms of the leads and the back of an exposed die pad will be coplanar because they are formed from one piece of copper, without bending in mechanical forming. The low-profile feet support PCB assembly using both wave soldering and reflow techniques. Because the foot merged into its heat tab provides a large periphery for soldering the package offers low thermal resistance even in cases where no solder is preplaced under heat tab. Without long bond wires and the need for long leads for bending, the footed package exhibits reduced inductance and improved PCB areal efficiency, supporting a larger die area for a given PCB footprint than conventional power packages. Moreover, the footed power package can support any number of leads or lead pitches and may be located on one, two or three sides of the package with no requirement to tie leads to die pad. By completely eliminating the need to bend the leads, the cost of lead-bending machinery and the consequent yield loss can be completely eliminated. Finally, with careful design, the flexibility of the footed package can support a large range of package options using a limited number of molds and costs associated with custom mold design.

We claim:

1. A method of fabricating a footed power package from a metal sheet, the footed power package comprising a die pad, a heat tab and a lead, the method comprising:
   depositing a first mask layer on a first surface of the metal sheet, the first mask layer covering the die pad and having a first opening;
   partially etching the metal sheet through the first opening in the first mask layer to form a first etched region and a surface of a cantilever segment of the lead;
   depositing a second mask layer on a second surface of the metal sheet, the second mask layer covering the die pad and the heat tab, the second mask layer having a first opening and a second opening;
   etching the metal sheet through the first opening in the second mask layer to form a second etched region, the second etched region merging with the first etched region so as to form a gap between the cantilever segment of the lead and the die pad; and
   etching the metal sheet through the second opening in the second mask layer so as to form a foot of the lead, the second opening in the second mask layer being vertically offset from the first opening in the first mask layer such that the foot of the lead and the cantilever segment of the lead remain connected to each other by a vertical column segment.

2. The method of claim 1 wherein the first mask layer has a second opening, an edge of the second opening in the first mask layer being aligned with an edge of the power package, the method comprising etching the metal sheet through the second opening in the first mask layer so as to form a third etched region.

3. The method of claim 2 wherein the second mask layer has a third opening, the method comprising etching the metal sheet through the third opening in the second mask layer so as to form a fourth etched region and a foot of the heat tab.

4. The method of claim 3 wherein the third and fourth etched regions merge so as to form a street adjacent to the power package.

5. The method of claim 3 wherein said etching through the first opening in the second mask layer and said etching through the third opening in the second mask layer are performed simultaneously in a single etching process.

6. The method of claim 5 wherein said etching through the first opening in the second mask layer, said etching through the second opening in the second mask layer and said etching through the third opening in the second mask layer are performed simultaneously in a single etching process.

7. The method of claim 2 wherein said etching through the first opening in the first mask layer and said etching through said second opening in the first mask layer are performed simultaneously in a single etching process.

8. The method of claim 7 wherein said etching through the first opening in the second mask layer, said etching through the second opening in the second mask layer and said etching through the third opening in the second mask layer are performed simultaneously in a single etching process.

9. The method of claim 8 wherein etching the metal sheet comprises wet chemical etching.

10. The method of claim 8 wherein etching the metal sheet comprises plasma or reactive ion etching.

11. The method of claim 8 wherein etching the metal sheet through the first opening in the first metal layer removes 50% to 90% of the thickness of the metal sheet.

12. The method of claim 11 comprising mounting a semiconductor die on a surface of the die pad.

13. The method of claim 12 comprising connecting an electrically conductive bonding wire between the die and the cantilever segment of the lead.

14. The method of claim 13 comprising encapsulating the die and the bonding wire in a plastic molding compound, the molding compound covering a surface of die pad and a portion of the lead and filling an area between the die pad and the lead, the heat tab and at least a portion of the foot of the lead being left exposed.

* * * * *